(12) United States Patent
Lim

(10) Patent No.: US 12,108,599 B2
(45) Date of Patent: Oct. 1, 2024

(54) SEMICONDUCTOR MEMORY DEVICE AND A METHOD OF MANUFACTURING THE SAME

(71) Applicant: SAMSUNG ELECTRONICS CO., LTD., Suwon-si (KR)

(72) Inventor: Geun-won Lim, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 18/206,402

(22) Filed: Jun. 6, 2023

(65) Prior Publication Data

US 2023/0320098 A1    Oct. 5, 2023

Related U.S. Application Data

(60) Division of application No. 17/490,080, filed on Sep. 30, 2021, now Pat. No. 11,706,923, which is a
(Continued)

(30) Foreign Application Priority Data

Dec. 14, 2018    (KR) .................. 10-2018-0162155

(51) Int. Cl.
*H10B 43/27*    (2023.01)
*H10B 43/10*    (2023.01)
(Continued)

(52) U.S. Cl.
CPC ............. *H10B 43/27* (2023.02); *H10B 43/10* (2023.02); *H10B 43/35* (2023.02); *H10B 43/40* (2023.02)

(58) Field of Classification Search
CPC ........ H10B 43/27; H10B 43/10; H10B 43/35; H10B 43/40; H10B 41/27; H10B 43/50;
(Continued)

(56) References Cited

U.S. PATENT DOCUMENTS 8,344,385 B2    1/2013    Kim et al.
8,946,665 B2    2/2015    Shim et al.
(Continued)

FOREIGN PATENT DOCUMENTS

CN    106887404 A    6/2017
CN    107359165 A    11/2017
(Continued)

OTHER PUBLICATIONS

Office Action issued in corresponding KR Patent Application No. 10-2018-0162155 on Oct. 20, 2023.
(Continued)

*Primary Examiner* — Jonathan Han
(74) *Attorney, Agent, or Firm* — F. CHAU & ASSOCIATES, LLC

(57) ABSTRACT

A semiconductor memory device including: a common source line; a substrate on the common source line; a plurality of gate electrodes arranged on the substrate and spaced apart from each other in a first direction perpendicular to a top surface of the common source line; a plurality of insulation films arranged among the plurality of gate electrodes; a plurality of channel structures penetrating through the plurality of gate electrodes and the plurality of insulation films in the first direction; and a plurality of residual sacrificial films arranged on the substrate and spaced apart from each other in the first direction, wherein the plurality of gate electrodes are disposed on opposite sides of the plurality of residual sacrificial films.

19 Claims, 26 Drawing Sheets

Related U.S. Application Data continuation of application No. 16/512,862, filed on Jul. 16, 2019, now Pat. No. 11,152,387.

(51) Int. Cl.
*H10B 43/35* (2023.01)
*H10B 43/40* (2023.01)

(58) Field of Classification Search
CPC ........ H10B 41/50; H10B 41/41; H10B 41/35; H01L 21/768
See application file for complete search history.

(56) References Cited

U.S. PATENT DOCUMENTS

| | | |
|---|---|---|
| 9,653,562 B2 | 5/2017 | Kim et al. |
| 9,761,606 B1 | 9/2017 | Ishida et al. |
| 9,806,093 B2 | 10/2017 | Toyama et al. |
| 9,818,693 B2 | 11/2017 | Toyama et al. |
| 9,818,759 B2 | 11/2017 | Kai et al. |
| 9,847,341 B2 | 12/2017 | Shin et al. |
| 9,876,031 B1 | 1/2018 | Shimizu et al. |
| 9,978,756 B2 | 5/2018 | Kim et al. |
| 10,141,326 B1 | 11/2018 | Oh et al. |
| 11,152,387 B2 | 10/2021 | Lim |
| 2016/0049422 A1 | 2/2016 | Kim et al. |
| 2017/0141121 A1* | 5/2017 | Freeman ................ H10B 43/27 |
| 2017/0179154 A1* | 6/2017 | Furihata ................ H10B 41/41 |
| 2017/0236830 A1* | 8/2017 | Inatsuka ................ H10B 41/27 257/620 |
| 2017/0263631 A1 | 9/2017 | Fujiki et al. |
| 2017/0309635 A1 | 10/2017 | Kim et al. |
| 2017/0323900 A1 | 11/2017 | Kanamori et al. |
| 2017/0358356 A1 | 12/2017 | Lee |
| 2018/0047744 A1 | 2/2018 | Utsumi |
| 2020/0194453 A1 | 6/2020 | Lim |
| 2022/0020767 A1 | 1/2022 | Lim |

FOREIGN PATENT DOCUMENTS

| | | |
|---|---|---|
| CN | 108377660 A | 8/2018 |
| KR | 10-2018-0095499 | 8/2018 |

OTHER PUBLICATIONS

1st OA issued in Corresponding Application No. CN Patent Application No. 201910858574.5 on Jul. 31, 2024.

* cited by examiner

SEMICONDUCTOR MEMORY DEVICE AND A METHOD OF MANUFACTURING THE SAME

CROSS-REFERENCE TO RELATED APPLICATIONS

This application is a divisional of U.S. patent application Ser. No. 17/490,080 filed on Sep. 30, 2021, which is a continuation of U.S. patent application Ser. No. 16/512,862 filed on Jul. 16, 2019, which claims priority under 35 U.S.C. § 119 to Korean Patent Application No. 10-2018-0162155, filed on Dec. 14, 2018, in the Korean Intellectual Property Office, the disclosures of which are incorporated by reference herein in their entireties.

TECHNICAL FIELD

The inventive concept relates to a semiconductor memory device and a method of manufacturing the same, and more particularly, to a semiconductor memory device having a three-dimensional structure and a method of manufacturing the semiconductor memory device.

DISCUSSION OF RELATED ART

Information and communication devices with multi-functional characteristics employ memory devices that have a high capacity and a high integration density. As memory cells decrease in size, operating circuits and/or a wiring structure, which are included in a memory device, have gotten more complex. Therefore, a memory device with an increased integration density may see a drop in its electrical characteristics.

SUMMARY

According to an exemplary embodiment of the inventive concept, there is provided a semiconductor memory device including a common source line; a substrate on the common source line; a plurality of gate electrodes arranged on the substrate and spaced apart from each other in a first direction perpendicular to a top surface of the common source line; a plurality of insulation films arranged among the plurality of gate electrodes; a plurality of channel structures penetrating through the plurality of gate electrodes and the plurality of insulation films in the first direction, and a plurality of residual sacrificial films arranged on the substrate and spaced apart from each other in the first direction, wherein the plurality of gate electrodes are disposed on opposite sides of the plurality of residual sacrificial films.

According to another exemplary embodiment of the inventive concept, there is provided a semiconductor memory device including a substrate; a box structure on the substrate; and a plurality of through vias penetrating through the box structure, wherein the box structure includes: a plurality of residual sacrificial films spaced apart from each other in a first direction perpendicular to a top surface of the substrate; and a plurality of insulation films arranged among the plurality of residual sacrificial films.

According to still another exemplary embodiment of the inventive concept, there is provided a semiconductor memory device including a substrate; first and second gate stack structures extending on the substrate in a horizontal direction and including a plurality of gate electrode layers stacked in a vertical direction, the plurality of gate electrode layers having conductivity; a plurality of channel structures penetrating through one of the first and second gate stack structures in the vertical direction; a residual sacrificial film stack structure arranged between the first and second gate stack structures and including a plurality of sacrificial films stacked in the vertical direction, the plurality of sacrificial films having an insulating property; and a common source line tapping wiring disposed on the residual sacrificial film stack structure.

According to a further exemplary embodiment of the inventive concept, there is provided a method of manufacturing a semiconductor memory device. The method includes forming a common source line and a substrate on a peripheral circuit including a peripheral transistor; forming a preliminary stack structure including sacrificial films and insulation films alternately stacked on the substrate; forming channel structures penetrating through the preliminary stack structure; and forming first and second word line cuts penetrating the preliminary stack structure and extending on the substrate in a first direction, the first word line cuts having a different length than the second word line cuts in the first direction.

According to an exemplary embodiment of the inventive concept, there is provided a semiconductor memory device including: a common source line disposed on an insulating layer; a substrate overlapping the common source line; a gate electrode stack disposed on the substrate; a sacrificial film structure disposed on the substrate, wherein the gate electrode stack is disposed on opposite sides of the sacrificial film structure; a first via penetrating the sacrificial film structure and electrically connecting to a transistor; and a second via penetrating the sacrificial film structure and contacting the common source line.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Figure 1:
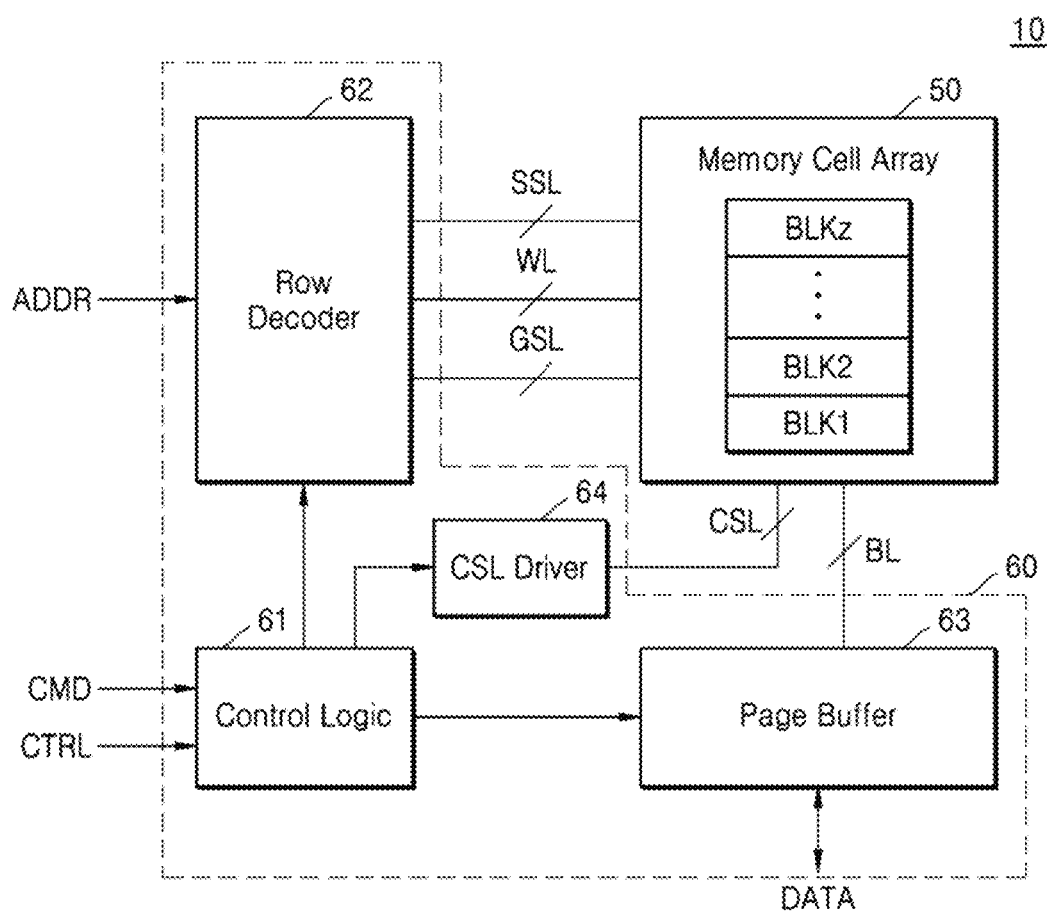
FIG. 1 is a block diagram of a semiconductor memory device according to exemplary embodiments of the inventive concept.

FIG. 1 is a block diagram of a semiconductor memory device 10 according to exemplary embodiments of the inventive concept. The semiconductor memory device 10 may include a memory cell array 50 and a peripheral circuit 60. According to exemplary embodiments of the inventive concept, the semiconductor memory device 10 may further include a data input/output circuit or an input/output interface.

The memory cell array 50 may be connected to string selection lines SSL, word lines WL, ground selection lines GSL, and bit lines BL. The peripheral circuit 60 may include a control logic 61, a row decoder 62, and a page buffer 63. According to exemplary embodiments of the inventive concept, the memory cell array 50 may be connected to the row decoder 62 through the string selection lines SSL, the word lines WL, and the ground selection lines GSL. The memory cell array 50 may be connected to the page buffer 63 through the bit lines BL, and connected to a common source line (CSL) driver 64 through a common source line CSL.

The memory cell array 50 may include a plurality of memory cells. According to exemplary embodiments of the inventive concept, the memory cells of the memory cell array 50 may include flash memory cells. Hereinafter, it is assumed that the memory cells are NAND flash memory cells in the descriptions of the following embodiments, but the inventive concept is not limited thereto. For example, the memory cells may include resistive memory cells such as resistive random access memory (ReRAM) cells, phase-change RAM (PRAM) cells, or magnetic RAM (MRAM) cells.

The memory cell array 50 may include a plurality of blocks, e.g., first through z-th blocks BLK1 through BLKz. Each block may have a planar structure or a three-dimensional (3D) structure. According to exemplary embodiments of the inventive concept, the memory cell array 50 may include at least one of a single-level cell (SLC) block including SLCs, a multi-level cell (MLC) block including MLCs, a triple-level cell (TLC) block including TLCs, and a quad-level cell (QLC) block including QLCs. According to exemplary embodiments of the inventive concept, some of the first through z-th blocks BLK1 through BLKz may be SLC blocks and the others may be MLC blocks, TLC blocks, or QLC blocks.

The peripheral circuit 60 may receive an address ADDR, a command CMD, and a control signal CTRL from outside the semiconductor memory device 10. According to exemplary embodiments of the inventive concept, the peripheral circuit 60 may transmit data to an external device of the semiconductor memory device 10 or receive data from the external device. According to exemplary embodiments of the inventive concept, the peripheral circuit 60 may further include various sub circuits, such as a voltage generator circuit, which generates various voltages for the operations of the semiconductor memory device 10, and an error correction circuit, which corrects errors in data read from the memory cell array 50.

The control logic 61 may control all operations of the semiconductor memory device 10. The control logic 61 may control the semiconductor memory device 10 such that a memory operation corresponding to the command CMD provided from a memory controller is performed. The control logic 61 may generate various internal control signals used in the semiconductor memory device 10 in response to the control signal CTRL provided from the memory controller. According to exemplary embodiments of the inventive concept, the control logic 61 may control a voltage level for the word lines WL and the bit lines BL during a memory operation such as a program operation or an erase operation.

The row decoder 62 may select at least one of the first through z-th blocks BLK1 through BLKz in response to the address ADDR provided from the memory controller. The row decoder 62 may select at least one of word lines of a memory block selected in response to the address ADDR.

The row decoder 62 may transmit a voltage for a memory operation to the selected word line of the selected memory block. For example, during a program operation, the row decoder 62 may transmit a program voltage and a verify voltage to the selected word line and a pass voltage to an unselected word line. In addition, the row decoder 62 may select some of the string selection lines SSL in response to the address ADDR.

The page buffer 63 may be connected to the memory cell array 50 through the bit lines BL. The page buffer 63 may operate as a write driver or a sense amplifier. For example, during a program operation, the page buffer 63 may operate as the write driver and apply a voltage for data to be stored in the memory cell array 50 to the bit lines BL. During a read operation, the page buffer 63 may operate as the sense amplifier and sense data stored in the memory cell array 50.

The CSL driver 64 may be connected to the memory cell array 50 through the common source line CSL. The CSL driver 64 may apply a common source voltage to the common source line CSL under the control of the control logic 61.

Figure 2:
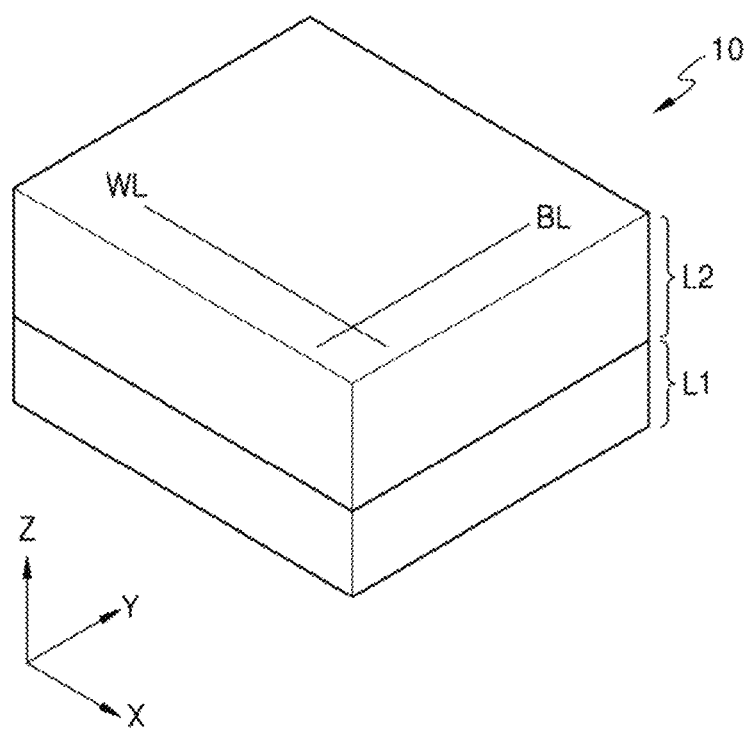
FIG. 2 is a schematic perspective view of a semiconductor memory device according to exemplary embodiments of the inventive concept.

FIG. 2 is a view schematically illustrating the structure of the semiconductor memory device 10 of FIG. 1, according to exemplary embodiments of the inventive concept. The semiconductor memory device 10 may include the memory cell array 50 and the peripheral circuit 60. Elements of the semiconductor memory device 10 may be formed through semiconductor manufacturing processes.

Referring to FIGS. 1 and 2, the semiconductor memory device 10 may include a first semiconductor device layer L1 and a second semiconductor device layer L2. According to exemplary embodiments of the inventive concept, the second semiconductor device layer L2 may be arranged on the first semiconductor device layer L1 in a first direction, e.g., a Z-direction. According to exemplary embodiments of the inventive concept, the memory cell array 50 in FIG. 1 may be formed in the second semiconductor device layer L2, and the peripheral circuit 60 in FIG. 1 may be formed in the first semiconductor device layer L1.

The first semiconductor device layer L1 may include a lower substrate. The first semiconductor device layer L1 may include semiconductor elements, e.g., transistors, on the lower substrate and a pattern for wiring of the semiconductor elements. For example, circuits corresponding to the control logic 61, the row decoder 62, the page buffer 63, and the CSL driver 64, which have been described with reference to FIG. 1, may be formed in the first semiconductor device layer LL.

The second semiconductor device layer L2 may include at least one conductive layer and an upper substrate on the conductive layer. According to exemplary embodiments of the inventive concept, a top surface of each of the upper and lower substrates may be substantially perpendicular to the first direction, e.g., the Z-direction, but the inventive concept is not limited thereto. According to exemplary embodiments of the inventive concept, the upper substrate may include a plurality of layers. The second semiconductor device layer L2 may include the memory cell array 50 on the upper substrate. According to exemplary embodiments of the inventive concept, the at least one conductive layer may operate as a common source for the memory cell array 50.

According to exemplary embodiments of the inventive concept, conductive patterns may be formed in the second semiconductor device layer L2 to connect the memory cell array 50 to the peripheral circuit 60 in the first semiconductor device layer L1. According to exemplary embodiments of the inventive concept, the word lines WL may extend in a second direction, e.g., an X-direction, perpendicular to the first direction, e.g., the Z-direction. According to exemplary embodiments of the inventive concept, the bit lines BL may extend in a third direction, e.g., a Y-direction, perpendicular to the first direction, e.g., the Z-direction. The first direction, e.g., the Z-direction, the second direction, e.g., the X-direction, and the third direction, e.g., the Y-direction, may be substantially perpendicular to one another. The term "vertical direction" used hereinafter may refer to a direction substantially parallel with the first direction, e.g., the Z-direction, and the term "vertical level" may refer to a height in the first direction, e.g., the Z-direction. In addition, the term "horizontal direction" may refer to a direction that is perpendicular to the second direction, e.g., the X-direction, the third direction, e.g., the Y-direction, or the first direction, e.g., the Z-direction, but is oblique to the second direction, e.g., the X-direction, and the third direction, e.g., the Y-direction.

The memory cells of the memory cell array 50 may be accessed via the word lines WL and the bit lines BL. The word lines WL and the bit lines BL may be electrically connected to the peripheral circuit 60 formed in the first semiconductor device layer L1.

Accordingly, the semiconductor memory device 10 may have a structure, e.g., a cell-on-peri or cell-over-peri (COP) structure, in which the memory cell array 50 and the peripheral circuit 60 are arranged in the first direction, e.g., the Z-direction. According to exemplary embodiments of the inventive concept, all circuits but the memory cell array 50 may be arranged below the memory cell array 50, and therefore, the COP structure may effectively reduce a horizontal area. Accordingly, the number of memory cells integrated into the semiconductor memory device 10 may be increased.

According to exemplary embodiments of the inventive concept, the semiconductor memory device 10 may further include a plurality of pads for electrical connection to external circuitry. For example, the semiconductor memory device 10 may include a plurality of pads for input/output of the command CMD, the address ADDR, and the control signal CTRL received from an external device or a plurality of pads for input/output of data. The pads may be arranged adjacent to the peripheral circuit 60.

Figure 3:
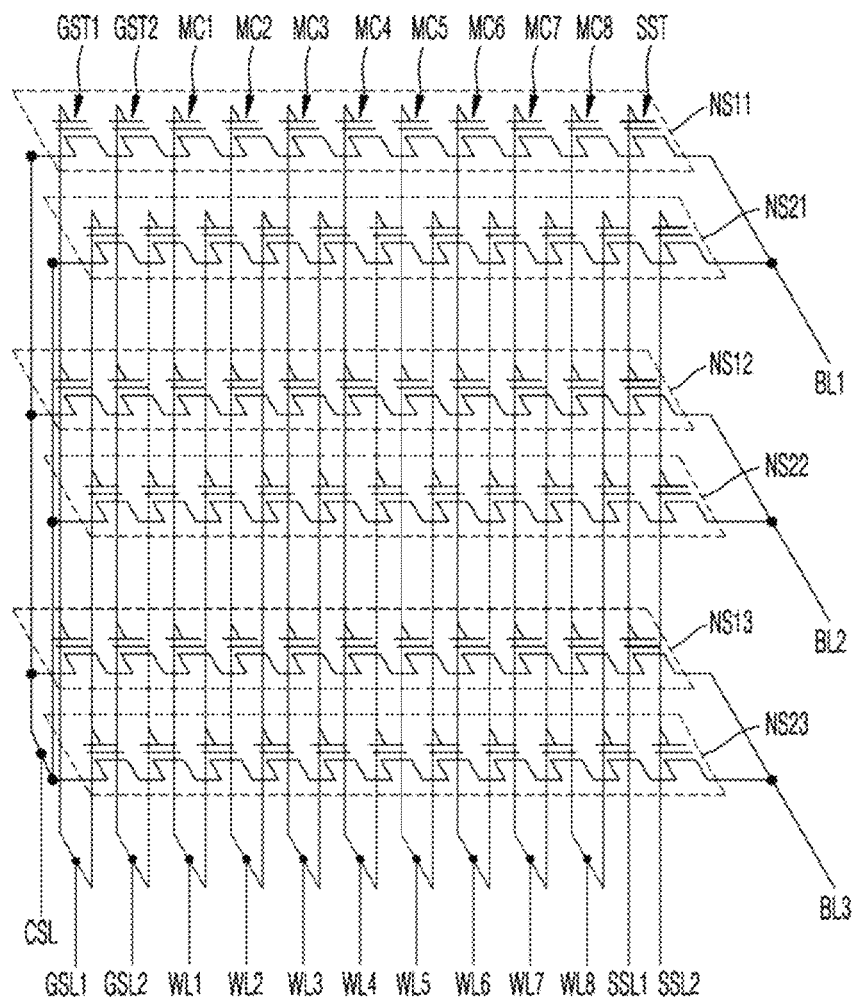
FIG. 3 is a circuit diagram for explaining an operation of a semiconductor memory device, according to an exemplary embodiment of the inventive concept.

FIG. 3 is a circuit diagram showing an equivalent circuit of the first memory block BLK1 among the first through z-th blocks BLK1 through BLKz in FIG. 1, according to an exemplary embodiment of the inventive concept. Referring to FIG. 3, the first memory block BLK1 may be implemented as NAND flash memory having a vertical structure. Like the first memory block BLK1, each of the second through z-th blocks BLK2 through BLKz (see FIG. 1) may be implemented as NAND flash memory. The first memory block BLK1 may include a plurality of NAND strings NS11, NS12, NS13, NS21, NS22 and NS23, a plurality of ground selection lines, e.g., first and second ground selection lines GSL1 and GSL2, a plurality of string selection lines, e.g., first and second string selection lines SSL1 and SSL2, a plurality of word lines, e.g., first through eighth word lines WL1, WL2, WL3, WL4, WL5, WL6, WL7 and WL8, a plurality of bit lines, e.g., first through third bit lines BL1, BL2 and BL3, and the common source line CSL. The numbers of NAND strings, word lines, bit lines, ground selection lines, and string selection lines may be variously changed according to exemplary embodiments of the inventive concept.

According to exemplary embodiments of the inventive concept, the NAND strings NS11 through NS23 may be connected between the first through third bit lines BL1 through BL3 and the common source line CSL. Each NAND string, e.g., the NAND string NS11, may include a string selection transistor SST, a plurality of memory cells MC1, MC2, MC3, MC4, MC5, MC6, MC7 and MC8, a first ground selection transistor GST1, and second ground selection transistor GST2, which are connected in series.

NAND strings connected in common to a single bit line may form a single column. For example, the NAND strings NS11 and NS21 connected in common to the first bit line BL1 may form a first column, the NAND strings NS12 and NS22 connected in common to the second bit line BL2 may form a second column, and the NAND strings NS13 and NS23 connected in common to the third bit line BL3 may form a third column.

NAND strings connected to a single string selection line may form a single row. For example, the NAND strings NS11, NS12, and NS13 connected to the first string selection line SSL1 may correspond to a first row, and the NAND strings NS21, NS22, and NS23 connected to the second string selection line SSL2 may correspond to a second row.

The string selection transistor SST may be connected to a corresponding one of the first string selection line SSL1 and the second string selection line SSL2. The memory cells MC1 through MC8 may be respectively connected to the first through eighth word lines WL1 through WL8. The first ground selection transistor GST1 and the second ground selection transistor GST2 may be respectively connected to the ground selection lines GSL1 and GSL2. The string selection transistor SST may be connected to a corresponding one of the first through third bit lines BL1 through BL3. The first ground selection transistor GST1 may be connected to the common source line CSL.

According to exemplary embodiments of the inventive concept, word lines (e.g., WL1) arranged at the same level may be connected to each other. According to exemplary embodiments of the inventive concept, the string selection lines SSL1 and SSL2 arranged at the same level may be separated from each other. For example, when memory cells, which are connected to the first word line WL1 and included in the NAND strings NS11, NS12, and NS13 corresponding to the first column, are programmed, the first word line WL1 and the first string selection line SSL1 are selected. According to exemplary embodiments of the inventive concept, there is one ground selection line, e.g., GSL1 or GSL2, at one level, but the inventive concept is not limited thereto. For example, there may be separate ground selection lines at one level.

Figure 4:
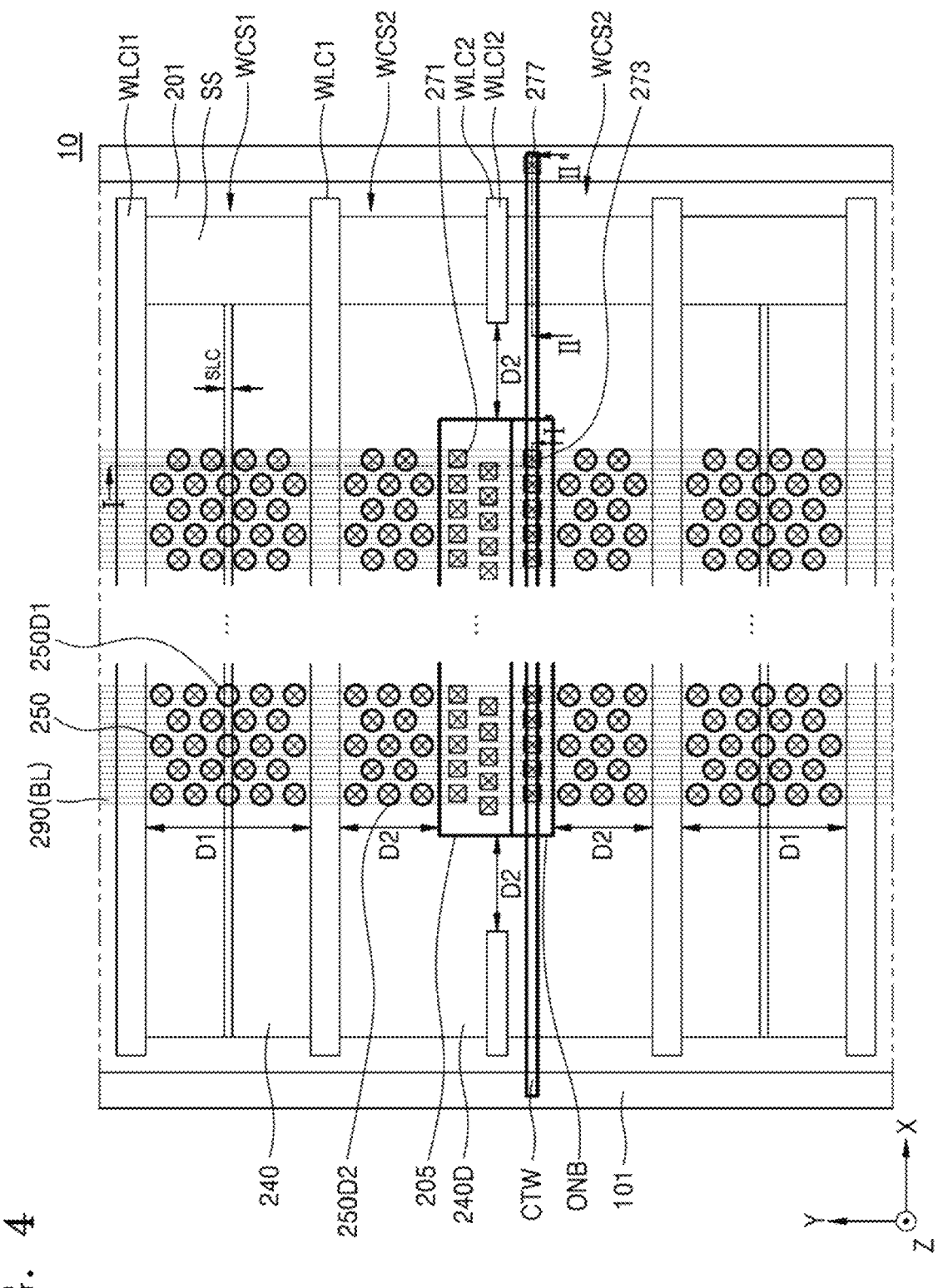
FIG. 4 is a plan view of a semiconductor memory device according to an exemplary embodiment of the inventive concept.
Figure 5A:
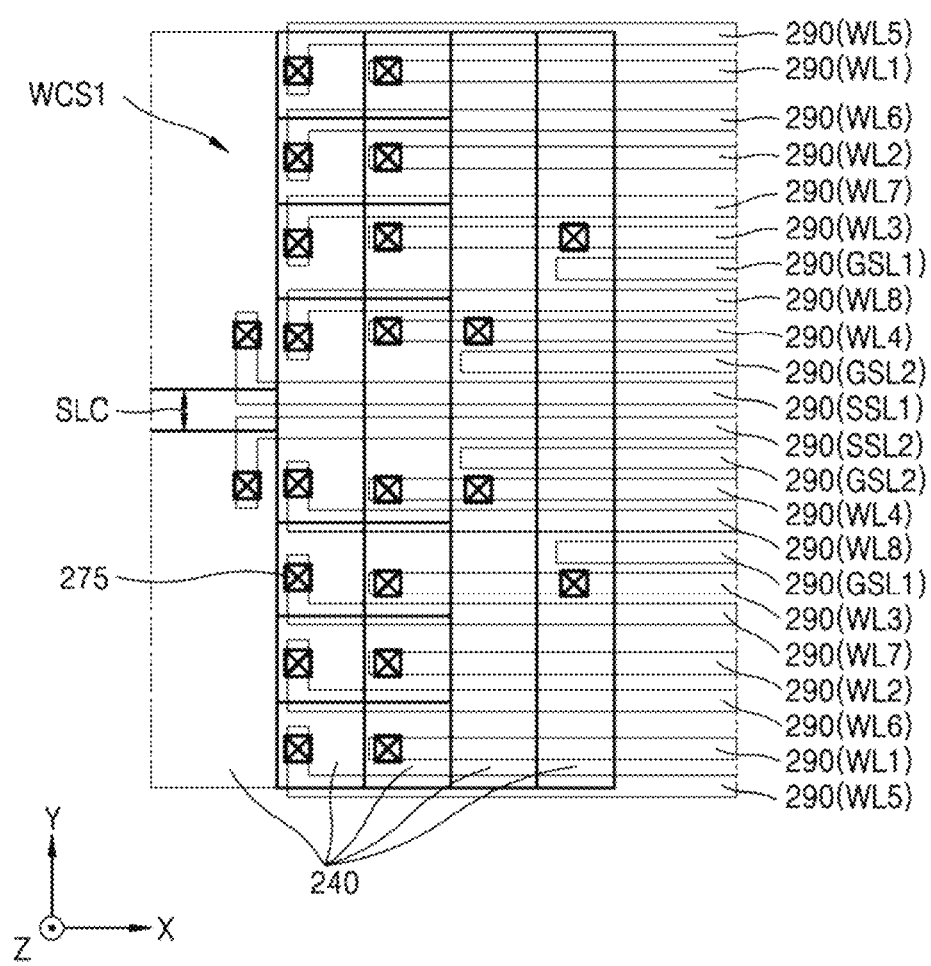
FIGS. 5A and 5B are enlarged plan views of respective portions of the semiconductor memory device of FIG. 4.
Figure 5B:
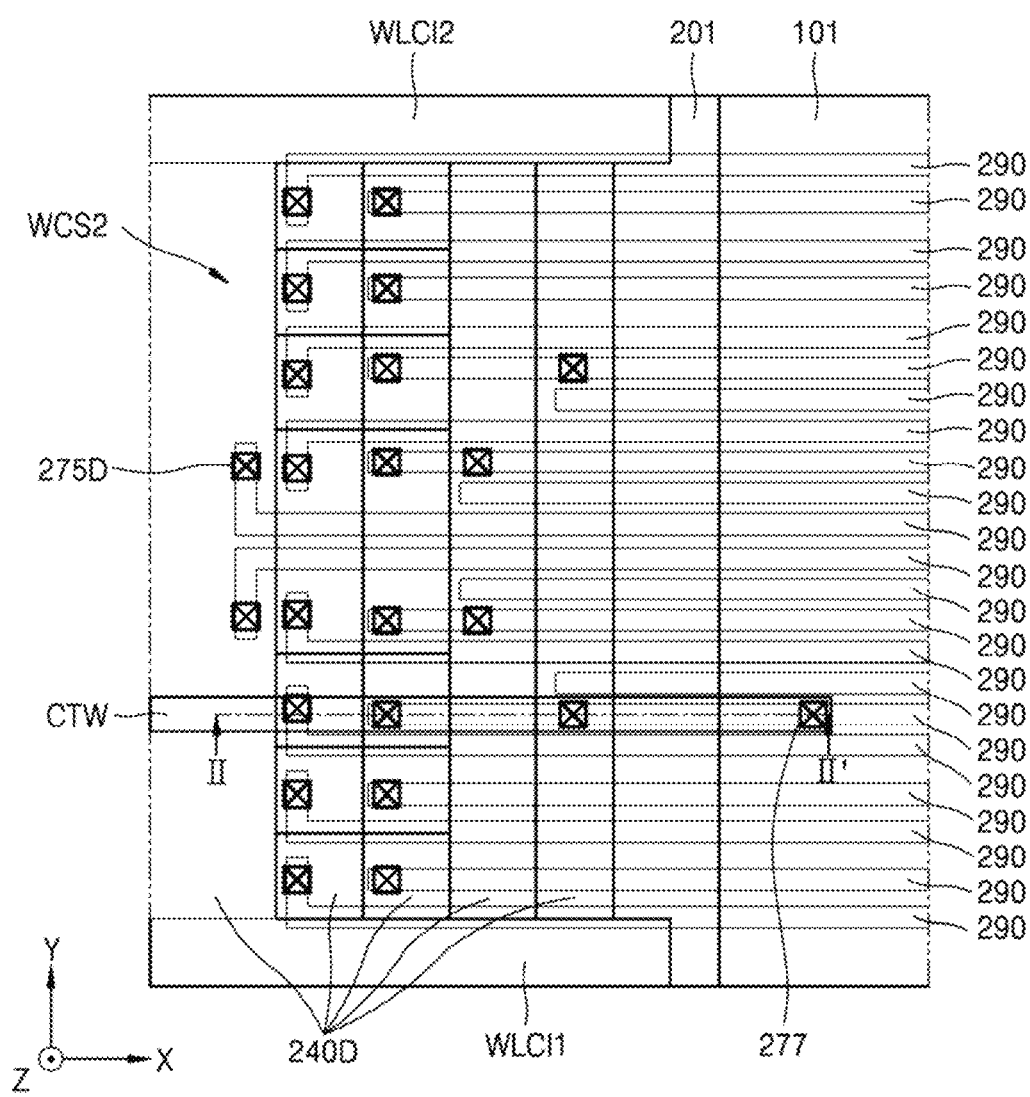

FIG. 4 is a plan view of the semiconductor memory device 10 according to an exemplary embodiment of the inventive concept. FIGS. 5A and 5B are enlarged plan views of respective portions of the semiconductor memory device 10 of FIG. 4. For example, FIGS. 5A and 5B are enlarged plan views of a first word line contact structure WCS1 and a second word line contact structure WCS2, respectively, of the semiconductor memory device 10. Line II-II' in FIG. 4 may correspond to line II-II' in FIG. 5B. FIGS. 6A through 6D are cross-sectional views taken along lines I-I' and II-II' in FIG. 4. For example, FIGS. 6A through 6D are cross-sectional views according to different embodiments of the inventive concept.

Referring to FIGS. 4 through 6A, the semiconductor memory device 10 may include the first semiconductor device layer L1 including a peripheral circuit and the second semiconductor device layer L2 including a memory cell array. The semiconductor memory device 10 may has a structure in which the second semiconductor device layer L2 is stacked on the first semiconductor device layer L1.

The first semiconductor device layer L1 may include a lower substrate 101, peripheral transistors 111 and 112 on the lower substrate 101, a peripheral circuit wiring electrically connected to the peripheral transistors 111 and 112, and a lower insulating layer 160 covering the peripheral transistors 111 and 112 and the peripheral circuit wiring. According to exemplary embodiments of the inventive concept, the lower insulating layer 160 may include an insulating material. According to exemplary embodiments of the inventive concept, the lower insulating layer 160 may include silicon oxide, silicon nitride, or silicon oxynitride but is not limited thereto.

According to exemplary embodiments of the inventive concept, the lower substrate 101 may include a semiconductor substrate including a semiconductor material such as monocrystalline silicon or monocrystalline germanium. A trench and an isolation layer 102 filling the trench may be formed to define an active region and a non-active region in the lower substrate 101.

According to exemplary embodiments of the inventive concept, the peripheral transistors 111 and 112 may form the peripheral circuit 60 in FIG. 1. According to exemplary embodiments of the inventive concept, some peripheral transistors, e.g., the peripheral transistor 112, may form the CSL driver 64 described with reference to FIG. 1. According to exemplary embodiments of the inventive concept, the peripheral transistor 112 may be connected to the common source line CSL through wirings formed in the first semiconductor device layer L1 and wirings formed in the second semiconductor device layer L2. According to exemplary embodiments of the inventive concept, the peripheral transistor 112 may provide a common source voltage to an upper substrate, which will be described below, through the common source line CSL.

The peripheral circuit wiring may include a plurality of peripheral conductive patterns 140 sequentially stacked on the lower substrate 101. The peripheral circuit wiring may further include a plurality of peripheral vias 130 connecting the peripheral transistors 111 and 112 to the peripheral conductive patterns 140 at different levels. Although it is illustrated that the peripheral circuit wiring includes the peripheral conductive patterns 140 at three levels and the peripheral vias 130 connecting the peripheral conductive patterns 140 to one another, the inventive concept is not limited thereto. The peripheral circuit wiring may include peripheral conductive lines at one level, two levels, or four or more levels and vias connecting the peripheral conductive lines to each other.

According to exemplary embodiments of the inventive concept, the peripheral conductive patterns 140 and the peripheral vias 130 may include a conductive material. According to exemplary embodiments of the inventive concept, the peripheral conductive patterns 140 and the peripheral vias 130 may include tungsten, tantalum, cobalt, nickel, tungsten silicide, tantalum silicide, cobalt silicide, or nickel silicide. According to exemplary embodiments of the inventive concept, the peripheral conductive patterns 140 and the peripheral vias 130 may include polysilicon.

The second semiconductor device layer L2 may include the common source line CSL, an upper substrate 201 on the common source line CSL, a stack structure SS, an O-N box ONB, and an upper insulating layer 260. The stack structure SS and the O-N box ONB are arranged on the upper substrate 201. The upper insulating layer 260 covers the stack structure SS, the O-N box ONB, the upper substrate 201. According to exemplary embodiments of the inventive concept, the second semiconductor device layer L2 may further include wirings for allowing the stack structure SS to operate as a memory cell array (50 in FIG. 1).

The common source line CSL may be arranged on the first semiconductor device layer L1. According to exemplary embodiments of the inventive concept, the common source line CSL may be flat. According to exemplary embodiments of the inventive concept, the common source line CSL may include tungsten (W) or a tungsten compound. According to exemplary embodiments of the inventive concept, the common source line CSL may be partially etched, and accordingly, a lower portion of an intermediate insulation film 205 may be arranged in an etched portion of the common source line CSL to be surrounded by the common source line CSL.

According to exemplary embodiments of the inventive concept, the upper substrate 201 may be a support layer for supporting the stack structure SS and the O-N box ONB. According to exemplary embodiments of the inventive concept, the upper substrate 201 may include a plurality of layers but is not limited thereto. For example, the upper substrate 201 may be a single layer. According to exemplary embodiments of the inventive concept, the upper substrate 201 may include a first upper substrate layer 201a on the common source line CSL, a second upper substrate layer 201b on the first upper substrate layer 201a, and a third upper substrate layer 201c on the second upper substrate layer 201b. According to exemplary embodiments of the inventive concept, the first upper substrate layer 201a may be in contact with the second upper substrate layer 201b. According to exemplary embodiments of the inventive concept, the second upper substrate layer 201b may be in contact with the third upper substrate layer 201c. According to exemplary embodiments of the inventive concept, the second upper substrate layer 201b may include an opening exposing a top surface of the first upper substrate layer 201a. According to exemplary embodiments of the inventive concept, the third upper substrate layer 201c may partially contact the first upper substrate layer 201a via the opening.

According to exemplary embodiments of the inventive concept, the intermediate insulation film 205 may extend to the same level as a top surface of the upper substrate 201. According to exemplary embodiments of the inventive concept, the intermediate insulation film 205 may be surrounded by the first through third upper substrate layers 201a through 201c. According to exemplary embodiments of the inventive concept, the intermediate insulation film 205 may be in contact with the first through third upper substrate layers 201a through 201c.

According to exemplary embodiments of the inventive concept, the first through third upper substrate layers 201a through 201c may include polysilicon. According to exemplary embodiments of the inventive concept, the first through third upper substrate layers 201a through 201c may include a doped polysilicon film. According to exemplary embodiments of the inventive concept, the first through third upper substrate layers 201a through 201c may be doped at about the same concentration as one another.

The first through third upper substrate layers 201a through 201c may include a bulk silicon substrate, a silicon-on-insulator (SOI) substrate, a germanium substrate, a germanium-on-insulator (GOI) substrate, a silicon germanium substrate, or an epitaxial thin-film substrate obtained through selective epitaxial growth (SEG). The first through third upper substrate layers 201a through 201c may include silicon (Si), germanium (Ge), silicon germanium (SiGe), gallium arsenide (GaAs), indium gallium arsenide (InGaAs), aluminum gallium arsenide (AlGaAs), or a mixture thereof.

Figure 6A:
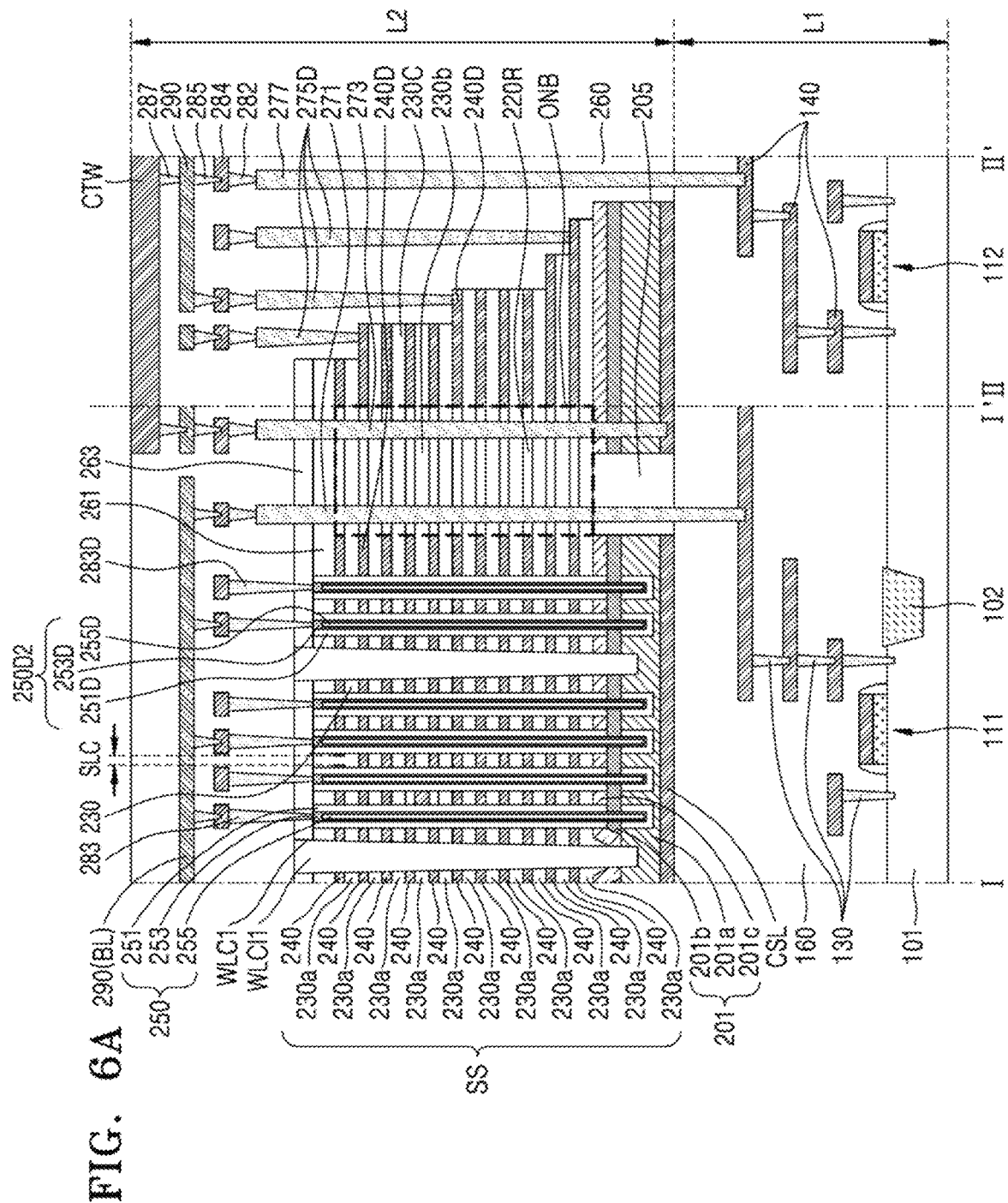
FIGS. 6A, 6B, 6C and 6D are cross-sectional views taken along lines I-I' and II-II' in FIG. 4.

The stack structure SS may be arranged on the upper substrate 201. The stack structure SS may include a plurality of gate electrodes 240 spaced apart from each other in the first direction, e.g., the Z-direction. According to exemplary embodiments of the inventive concept, the gate electrodes 240 may correspond to the first and second ground selection transistors GST1 and GST2, the memory cells MC1 through MC8, and the string selection transistor SST, which have been described with reference to FIG. 3, in order starting from the upper substrate 201. Although it is illustrated in FIG. 6A that eight gate electrodes 240 operate as memory cells, the inventive concept is not limited thereto. For example, various numbers of gate electrodes 240, e.g., 4, 16, 32, or 64 gate electrodes 240, may operate as memory cells.

According to exemplary embodiments of the inventive concept, at least one dummy gate electrode may also be arranged between a gate electrode 240 corresponding to the second ground selection transistor GST2 (see FIG. 3) and a gate electrode 240 corresponding to the memory cell MC1. In the alternative, at least one dummy gate electrode may be arranged between a gate electrode 240 corresponding to the string selection transistor SST (see FIG. 3) and a gate electrode 240 corresponding to the memory cell MC8. In this case, inter-cell interference between adjacent gate electrodes 240 may be reduced.

According to exemplary embodiments of the inventive concept, the gate electrodes 240 may include a conductive material. According to exemplary embodiments of the inventive concept, the gate electrodes 240 may include tungsten, tantalum, cobalt, nickel, tungsten silicide, tantalum silicide, cobalt silicide, or nickel silicide. According to exemplary embodiments of the inventive concept, the gate electrodes 240 may include polysilicon. According to exemplary embodiments of the inventive concept, first through third through vias 271, 273, and 277, word line contact vias 275, bit line contact vias 283, first through third upper conductive vias 282, 285, and 287, first and second upper conductive patterns 284 and 290, and dummy bit line contact vias 283D, which will be described below, may include at least one of the materials mentioned as examples above in association with the gate electrodes 240.

A first portion 230a of each of insulation films 230 may be arranged between adjacent gate electrodes 240. Accordingly, the stack structure SS may include the gate electrodes 240 and the first portion 230a of each insulation film 230. According to exemplary embodiments of the inventive concept, a first upper insulating layer 261 and a second upper insulating layer 263 may be arranged on the stack structure SS. The first upper insulating layer 261 and the second upper insulating layer 263 may include an insulating material.

According to exemplary embodiments of the inventive concept, a plurality of channel structures 250 may penetrate through the first upper insulating layer 261 and the stack structure SS in the first direction, e.g., the Z-direction. According to exemplary embodiments, the channel structures 250 may penetrate at least a portion of the upper substrate 201. According to exemplary embodiments of the inventive concept, the channel structures 250 may penetrate at least a portion of the first upper substrate layer 201a. Accordingly, respective top surfaces of the channel structures 250 may form one plane with a top surface of the first upper insulating layer 261, and respective bottom surfaces of the channel structures 250 may be at a level lower than a top surface of the first upper substrate layer 201a. Adjacent channel structures 250 may be spaced apart from each other by a certain distance in the second and third directions, e.g., the X- and Y-directions.

According to exemplary embodiments of the inventive concept, each of the channel structures 250 may include a plurality of layers. According to exemplary embodiments of the inventive concept, each of the channel structures 250 may include a gate insulating film 251, a channel layer 253, and a buried insulating film 255.

According to exemplary embodiments of the inventive concept, the gate insulating film 251 may have a conformal thickness. According to exemplary embodiments of the inventive concept, the gate insulating film 251 may form a bottom surface and an outer surface of each channel structure 250. Accordingly, the gate insulating film 251 may insulate the channel layer 253 from the gate electrodes 240.

According to exemplary embodiments of the inventive concept, the gate insulating film 251 may include a plurality of layers having a conformal thickness. According to exemplary embodiments of the inventive concept, the gate insulating film 251 may include a tunnel insulating layer, a charge storage layer, and a blocking insulating layer. In this case, a barrier metal layer may be further arranged between the gate insulating film 251 and the gate electrodes 240. The tunnel insulating layer may include silicon oxide, hafnium oxide, aluminum oxide, zirconium oxide, or tantalum oxide. The charge storage layer may be a region, in which electrons tunneling from the channel layer 253 are stored. The charge storage layer may include silicon nitride, boron nitride, silicon boron nitride, or impurity-doped polysilicon. The blocking insulating layer may include a single layer including silicon oxide, silicon nitride, hafnium oxide, aluminum oxide, zirconium oxide, or tantalum oxide, or a stack layer thereof. However, a material of the blocking insulating layer is not limited thereto and may include a dielectric material having a high dielectric constant.

According to exemplary embodiments of the inventive concept, the gate insulating film 251 may not be at the same level as the second upper substrate layer 201b. This is due to the partial removal of the gate insulating film 251 by a replacement process for the second upper substrate layer 201b. Therefore, the channel layer 253 may be in contact with the second upper substrate layer 201b.

According to exemplary embodiments of the inventive concept, the channel layer 253 may partially fill an inner space defined by the gate insulating film 251. The channel layer 253 formed on an inner surface of the gate insulating film 251 may have a conformal thickness. According to exemplary embodiments of the inventive concept, a top portion of the channel layer 253 may be thicker than a side wall of the channel layer 252.

According to exemplary embodiments of the inventive concept, a space defined by the channel layer 253 may be filled with the buried insulating film 255. A top surface of the buried insulating film 255 may be covered with the top portion of the channel layer 253. According to exemplary embodiments of the inventive concept, a top surface of the channel layer 253 may function as a pad for electrical connection to a bit line contact via 283. In some cases, a separate contact pad may be provided on the top surface of the channel layer 253.

Although it is illustrated in FIG. 6A that the gate insulating film 251 covers a bottom surface of the channel layer 253, the inventive concept is not limited thereto. For example, a gate insulating film may expose a bottom surface of a channel layer and may form only a side wall of a channel structure. In this case, a semiconductor pattern grown from an upper substrate through SEG may be in contact with the bottom surface of the channel layer, and the channel layer may not be directly connected to the upper substrate.

According to exemplary embodiments of the inventive concept, the bit line contact vias 283 may be connected to an upper conductive pattern, which corresponds to a bit line BL among the second upper conductive patterns 290, through the first upper conductive patterns 284 and the second upper conductive vias 285. Accordingly, the channel structures 250 may be electrically connected to the bit line BL.

According to exemplary embodiments of the inventive concept, a first dummy channel structure 250D1 may penetrate through the stack structure SS. According to exemplary embodiments of the inventive concept, the first dummy channel structure 250D1 may be arranged among the channel structures 250. According to exemplary embodiments of the inventive concept, a selection line cut SLC may overlap the first dummy channel structure 250D1 in the vertical direction. Accordingly, the first dummy channel structure 250D1 may have a structure resulting from partially removing a top portion of each of the channel structures 250. According to exemplary embodiments of the inventive concept, the first dummy channel structure 250D1 may not be connected to the bit line BL.

According to exemplary embodiments of the inventive concept, a first word line cut WLC1 may penetrate through the first upper insulating layer 261, the second upper insulating layer 263, and the stack structure SS in the first direction, e.g., the Z-direction. According to exemplary embodiments of the inventive concept, the first word line cut WLC1 may partially penetrate the first upper substrate layer 201a.

According to exemplary embodiments of the inventive concept, a first word line cut filling film WLCI1 may fill an inner space of the first word line cut WLC1. According to exemplary embodiments of the inventive concept, the first word line cut filling film WLCI1 may include an insulating material such as silicon oxide, silicon nitride, or silicon oxynitride. According to exemplary embodiments of the inventive concept, the first word line cut filling film WLCI1 may insulate gate electrodes 240 arranged at one vertical level. According to exemplary embodiments of the inventive concept, the first word line cut filling film WLCI1 may insulate a gate electrode 240 and a dummy gate electrode 240D, which are adjacent to each other and at the same vertical level.

According to exemplary embodiments of the inventive concept, a plurality of dummy gate electrodes 240D may be spaced apart from the gate electrodes 240 with the first word line cut filling film WLCI1 between the dummy gate electrodes 240D and the gate electrodes 240. According to exemplary embodiments of the inventive concept, the dummy gate electrodes 240D may be spaced apart from each other in the first direction, e.g., the Z-direction.

According to exemplary embodiments of the inventive concept, a plurality of residual sacrificial films 220R may be separated from the gate electrodes 240 with the first word line cut filling film WLCI1 between the residual sacrificial films 220R and the gate electrodes 240. According to exemplary embodiments of the inventive concept, the residual sacrificial films 220R may be spaced apart from each other in the first direction, e.g., the Z-direction. According to exemplary embodiments of the inventive concept, a second portion 230b of each of the insulation films 230 may be arranged between adjacent residual sacrificial films 220R, and a third portion 230C of each of the insulation films 230 may be arranged between adjacent dummy gate electrodes 240D.

According to exemplary embodiments of the inventive concept, the residual sacrificial films 220R and second portions 230b of the respective insulation films 230 may form the O-N box ONB. According to exemplary embodiments of the inventive concept, the first and second through vias 271 and 273 may penetrate through the O-N box ONB in the first direction, e.g., the Z-direction. According to exemplary embodiments of the inventive concept, a length of each of the first and second through vias 271 and 273 in the first direction, e.g., the Z-direction, may be greater than a length of the stack structure SS in the first direction, e.g., the Z-direction. Accordingly, the first and second through vias 271 and 273 may be in contact with the residual sacrificial films 220R and the insulation films 230.

According to exemplary embodiments of the inventive concept, the first through via 271 may also penetrate the intermediate insulation film 205 and a portion of the lower insulating layer 160. According to exemplary embodiments of the inventive concept, the first through via 271 may be connected to the peripheral transistor 111 via a peripheral wiring layer. According to exemplary embodiments of the inventive concept, the second through via 273 may be connected to the common source line CSL. According to exemplary embodiments of the inventive concept, a top portion of the common source line CSL may be partially etched during a process of forming the second through via 273, and accordingly, the common source line CSL may have a recessed structure. Therefore, a bottom surface of the second through via 273 may be at a level lower than a top surface of the common source line CSL.

According to exemplary embodiments of the inventive concept, the second through via 273 may be connected to a common source line tapping wiring CTW through the first through third upper conductive vias 282, 285, and 287 and the first and second upper conductive patterns 284 and 290. According to exemplary embodiments of the inventive concept, one of the bit lines BL may be connected to the common source line tapping wiring CTW through the third upper conductive via 287. According to exemplary embodiments of the inventive concept, a bit line BL connected to the common source line tapping wiring CTW may be used as a wiring for the common source line CSL and thus operate differently than other bit lines BL.

According to exemplary embodiments of the inventive concept, a second dummy channel structure 250D2 may penetrate through the dummy gate electrodes 240D. According to exemplary embodiments of the inventive concept, the second dummy channel structure 250D2 may have a similar structure to the channel structures 250. For example, a dummy gate insulating layer 251D, a dummy channel layer 253D, and a dummy buried insulating layer 255D of the second dummy channel structure 250D2 may respectively have the same structures as the gate insulating film 251, the channel layer 253, and the buried insulating film 255 of each of the channel structures 250. According to exemplary embodiments of the inventive concept, the second dummy channel structure 250D2 may be connected to a second upper conductive pattern 290, which is a bit line BL, through a dummy bit line contact via 283D and a second upper conductive via 285. Accordingly, the second dummy channel structure 250D2 may be electrically connected to the bit line BL but may not operate as a memory cell since the dummy gate electrodes 240D do not operate as gates of ground transistors, memory cells, and a string selection transistor.

As described below, a stack of the gate electrodes 240 and the dummy gate electrodes 240D may have a step shape. Although only a step shape of the dummy gate electrodes 240D and dummy word line contact vias 275D contacting thereto are shown in FIG. 6A, a step shape of the gate electrodes 240 and the word line contact vias 275 contacting thereto are substantially the same as shown in FIG. 6A. According to exemplary embodiments of the inventive concept, the dummy word line contact vias 275D may be connected to second upper conductive patterns 290 through the first upper conductive vias 282, the first upper conductive patterns 284, and the second upper conductive vias 285.

Similarly, referring to FIGS. 5A and 6A, the word line contact vias 275 may be connected to second upper conductive patterns 290, which respectively correspond to the first and second ground selection lines GSL1 and GSL2, the first through eighth word lines WL1 through WL8, and the first and second string selection lines SSL1 and SSL2, through the first upper conductive vias 282, the first upper conductive patterns 284, and the second upper conductive vias 285.

According to exemplary embodiments of the inventive concept, the upper insulating layer 260 may cover the common source line CSL, the upper substrate 201, the stack structure SS, the O-N box ONB, and wirings arranged thereon. According to exemplary embodiments of the inventive concept, the upper insulating layer 260 may include an insulating material such as silicon oxide, silicon nitride, or silicon oxynitride.

According to exemplary embodiments of the inventive concept, the third through via 277 may partially penetrate the upper insulating layer 260 and the lower insulating layer 160. According to exemplary embodiments of the inventive concept, the third through via 277 may be connected to a peripheral circuit wiring via the first through third upper conductive vias 282, 285, and 287 and the first and second upper conductive patterns 284 and 290. According to exemplary embodiments of the inventive concept, the third through via 277 may be connected to the peripheral transistor 112 corresponding to the CSL driver 64 described with reference to FIG. 1. Accordingly, the peripheral transistor 112 may be electrically connected to the common source line CSL.

Referring to the layout of FIG. 4, stack structures SS may be separated from each other by the first word line cut WLC1 extending in the second direction, e.g., the X-direction. According to exemplary embodiments of the inventive concept, a length of each of the stack structures SS in the second direction, e.g., the X-direction, may be less than a length of the first word line cut WLC1 in the second direction, e.g., the X-direction.

According to exemplary embodiments of the inventive concept, the O-N box ONB may be between adjacent stack structures SS. The stack structures SS may be separated from the O-N box ONB with the first word line cut filling film WLCI1 between the stack structures SS. The O-N box ONB may include the residual sacrificial films 220R, which have a flat shape and are spaced apart from each other in the first direction, e.g., the Z-direction, and the second portions 230b of the respective insulation films 230. Each of the second portions 230b of the insulation films 230 may be between adjacent residual sacrificial films 220R.

The intermediate insulation film 205 and a portion of the upper substrate 201 may be below the O-N box ONB. Accordingly, the O-N box ONB may be in contact with a top surface of the intermediate insulation film 205 and a top surface of the third upper substrate layer 201c. According to exemplary embodiments of the inventive concept, first through vias 271 may penetrate through the intermediate insulation film 205. According to exemplary embodiments of the inventive concept, second through vias 273 may be spaced apart from the intermediate insulation film 205 in the horizontal direction.

When a distance between two first word line cut filling films WLCI1 separated from each other with a stack structure SS therebetween is referred to as a first distance D1 and a distance between the O-N box ONB and a first word line cut filling film WLCI1 adjacent to the O-N box ONB is referred to as a second distance D2, the first distance D1 may be greater than the second distance D2. According to exemplary embodiments of the inventive concept, the first distance D1 may be about 1350 nm, and the second distance D2 may be about 1000 nm, but the inventive concept is not limited thereto. The second distance D2 may be a maximum distance for a replacement process, in which a sacrificial film is removed and a gate electrode is formed. Since first word line cut filling films WLCI1 extend substantially in parallel with each other, the first distance D1 is a minimum horizontal (for example, the third direction, e.g., the Y-direction) straight distance between adjacent first word line cut filling films WLCI1. Similarly, the second distance D2 is a minimum horizontal (for example, the third direction, e.g., the Y-direction) straight distance between the O-N box ONB and a first word line cut filling film WLCI1 adjacent to the O-N box ONB.

According to exemplary embodiments of the inventive concept, the first word line contact structure WCS1 may be formed at an end of a stack structure SS in the second direction, e.g., the X-direction, which is illustrated in detail in FIG. 5A. Although the first word line contact structure WCS1 is formed at an end of the stack structure SS in the second direction, e.g., the X-direction, and no first word line contact structures WCS1 are formed at an opposite end in FIG. 4, the inventive concept is not limited thereto. For example, the first word line contact structure WCS1 may be formed at each of opposite ends of the stack structure SS in the second direction, e.g., the X-direction.

A gate electrode 240 at a top layer may be divided by the selection line cut SLC. According to exemplary embodiments of the inventive concept, the selection line cut SLC may extend in the second direction, e.g., the X-direction, and may completely divide the gate electrode 240 at the top layer. According to exemplary embodiments of the inventive concept, a length of the selection line cut SLC in the second direction, e.g., the X-direction, may be less than a length of the first word line cut WLC1 in the second direction, e.g., the X-direction.

According to exemplary embodiments of the inventive concept, a plurality of dummy gate electrodes 240D may be arranged between first word line cut fill films WLCI1 which are adjacent to the O-N box ONB. The plurality of dummy gate electrodes 240D may be spaced apart from each other along the first direction, e.g., the Z direction. According to exemplary embodiments of the inventive concept, the dummy gate electrodes 240D may surround the O-N box ONB. According to exemplary embodiments of the inventive concept, a length of the dummy gate electrodes 240D in the third direction, e.g., the Y-direction, may be greater than a length of the gate electrodes 240 in the third direction, e.g., the Y-direction, but the inventive concept is not limited thereto. According to exemplary embodiments of the inventive concept, a length of each of the dummy gate electrodes 240D in the second direction, e.g., the X-direction, may be substantially the same as a length of each of the gate electrodes 240, which are at the same level as each dummy gate electrode 240D, in the second direction, e.g., the X-direction.

According to exemplary embodiments of the inventive concept, the second word line contact structure WCS2 may be formed at an end of each of the dummy gate electrodes 240D, which is illustrated in detail in FIG. 5B. Although the second word line contact structure WCS2 is formed at an end of each dummy gate electrode 240D in the second direction, e.g., the X-direction, and no second word line contact structures WCS2 are formed at an opposite end in FIG. 4, the inventive concept is not limited thereto. For example, the second word line contact structure WCS2 may be formed at both ends of the stacked structure SS or may not be formed.

According to exemplary embodiments of the inventive concept, a second word line cut WLC2 and a second word line cut filling film WLCI2 filling the second word line cut WLC2 may be arranged at each of the opposite ends of each dummy gate electrode 240D in the second direction, e.g., the X-direction. According to exemplary embodiments of the inventive concept, the second word line cut WLC2 may extend in the second direction, e.g., the X-direction. According to exemplary embodiments of the inventive concept, a length of the second word line cut WLC2 in the second direction, e.g., the X-direction, may be less than a length of the first word line cut WLC1 in the second direction, e.g., the X-direction. According to exemplary embodiments of the inventive concept, the second word line cut WLC2 may be shorter than the stack structure SS in the second direction, e.g., the X-direction. According to exemplary embodiments of the inventive concept, the second word line cut WLC2 may be shorter than the O-N box ONB in the second direction, e.g., the X-direction. According to exemplary embodiments of the inventive concept, the second word line cut WLC2 may penetrate through a portion of each dummy gate electrode 240D in the first direction, e.g., the Z-direction. The portion of each dummy gate electrode 240D is adjacent to an end of each dummy gate electrode 240D in the second direction, e.g., the X-direction.

According to exemplary embodiments of the inventive concept, a single second word line cut filling film WLCI2 may be between adjacent first word line cut filling films WLCI1, but the inventive concept is not limited thereto. For example, at least two second word line cut filling films WLCI2 may be between adjacent first word line cut filling films WLCI1. The number of second word line cut filling films WLCI2 between adjacent first word line cut filling films WLCI1 may be different depending on the size of the O-N box ONB. The number of second word line cut filling films WLCI2 at an end of each dummy gate electrode 240D in the second direction, e.g., the X-direction, may be different from the number of second word line cut filling films WLCI2 at an opposite end of each dummy gate electrode 240D. According to exemplary embodiments of the inventive concept, a distance between each second word line cut filling film WLCI2 and the O-N box ONB in the second direction, e.g., the X-direction, may be the second distance D2.

According to exemplary embodiments of the inventive concept, the common source line tapping wiring CTW may extend in the second direction, e.g., the X-direction. According to exemplary embodiments of the inventive concept, a length of the common source line tapping wiring CTW in the second direction, e.g., the X-direction, may be greater than a length of the common source line CSL in the second direction, e.g., the X-direction, but the inventive concept is not limited thereto. The length of the common source line tapping wiring CTW in the second direction, e.g., the X-direction, may be equal to or less than the length of the common source line CSL in the second direction, e.g., the X-direction.

According to exemplary embodiments of the inventive concept, the common source line tapping wiring CTW may protrude outward from the common source line CSL in the second direction, e.g., the X-direction. Although both ends of the common source line tapping wiring CTW in the second direction, e.g., the X-direction, protrude from the common source line CSL in FIG. 4, the inventive concept is not limited thereto. Only one end of the common source line tapping wiring CTW in the second direction, e.g., the X-direction, may protrude from the common source line CSL.

According to exemplary embodiments of the inventive concept, the common source line tapping wiring CTW may extend over the O-N box ONB. According to exemplary embodiments of the inventive concept, the common source line tapping wiring CTW may be electrically connected to a plurality of second through vias 273. Accordingly, the resistance of the common source line CSL may be reduced, and therefore, noise characteristics of the semiconductor memory device 10 may be improved. According to exemplary embodiments of the inventive concept, the common source line tapping wiring CTW may not vertically overlap the first through vias 271 and the intermediate insulation film 205.

A horizontal area of the lower substrate 101 may be greater than a horizontal area of each of the common source line CSL and the upper substrate 201. According to exemplary embodiments of the inventive concept, the whole area of each of the common source line CSL and the upper substrate 201 may vertically overlap the lower substrate 101. According to exemplary embodiments of the inventive concept, the horizontal area of the common source line CSL may be equal to that of the upper substrate 201, but the inventive concept is not limited thereto. According to exemplary embodiments of the inventive concept, the horizontal area of the common source line CSL may be greater than that of the upper substrate 201. According to exemplary embodiments of the inventive concept, a horizontal area of the stack structure SS may be less than that of the upper substrate 201.

Referring to FIG. 5A, the first word line contact structure WCS1 may have a step structure, in which a gate electrode 240 at a lower level protrudes further in the second direction, e.g., the X-direction, than a gate electrode 240 at an upper level. According to exemplary embodiments of the inventive concept, the first word line contact structure WCS1 may have the step structure in both the second direction, e.g., the X-direction, and the third direction, e.g., the Y-direction. According to exemplary embodiments of the inventive concept, the word line contact vias 275 may be formed on the step structure. According to exemplary embodiments of the inventive concept, each of the word line contact vias 275 may be in contact with a portion of a gate electrode 240 protruding further than a gate electrode 240 at an upper level in the second direction, e.g., the X-direction, or the third direction, e.g., the Y-direction.

As described below, the first and second upper conductive patterns 284 and 290 may be arranged above the stack structure SS. According to exemplary embodiments of the inventive concept, each of the second upper conductive patterns 290 may extend in the second direction, e.g., the X-direction. According to exemplary embodiments of the inventive concept, each second upper conductive pattern 290 extending on the first word line contact structure WCS1 may correspond to one of the first and second ground selection lines GSL1 and GSL2, the first through eighth word lines WL1 through WL8, and the first and second string selection lines SSL1 and SSL2, which have been described above with reference to FIG. 3.

According to exemplary embodiments of the inventive concept, second upper conductive patterns 290 respectively corresponding to the first and second ground selection lines GSL1 and GSL2 may be sequentially connected to two gate electrodes 240 arranged at the bottom of the stack structure SS. According to exemplary embodiments of the inventive concept, a second upper conductive pattern 290 corresponding to each of the first and second string selection lines SSL1 and SSL2 may be connected to a gate electrode 240 at a top level of the stack structure SS. According to exemplary embodiments of the inventive concept, second upper conductive patterns 290 respectively corresponding to the first through eighth word lines WL1 through WL8 may be sequentially connected to gate electrodes 240 respectively at third through tenth levels from the bottom of the stack structure SS.

Referring to FIGS. 5A and 5B, the second word line contact structure WCS2 may have a similar structure to the first word line contact structure WCS1. However, the dummy gate electrodes 240D of the second word line contact structure WCS2 do not operate as gates of memory cells. Accordingly, the dummy word line contact vias 275D and second upper conductive patterns 290 in the second word line contact structure WCS2 may not perform circuit operations for driving the memory cells. Accordingly, the dummy word line contact vias 275D and the second upper conductive patterns 290 may be entirely or partially omitted from the second word line contact structure WCS2.

Figure 6B:
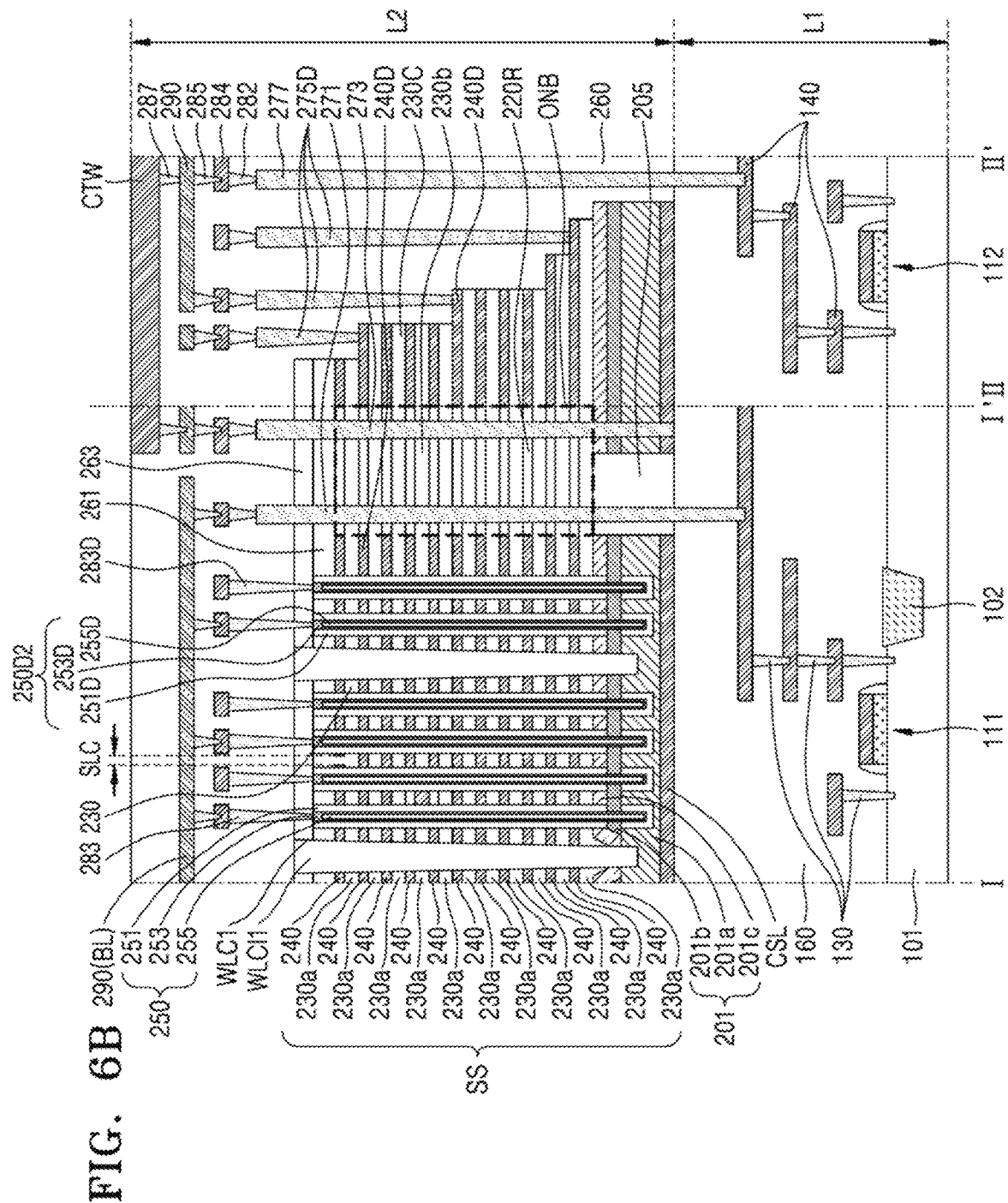
Figure 6C:
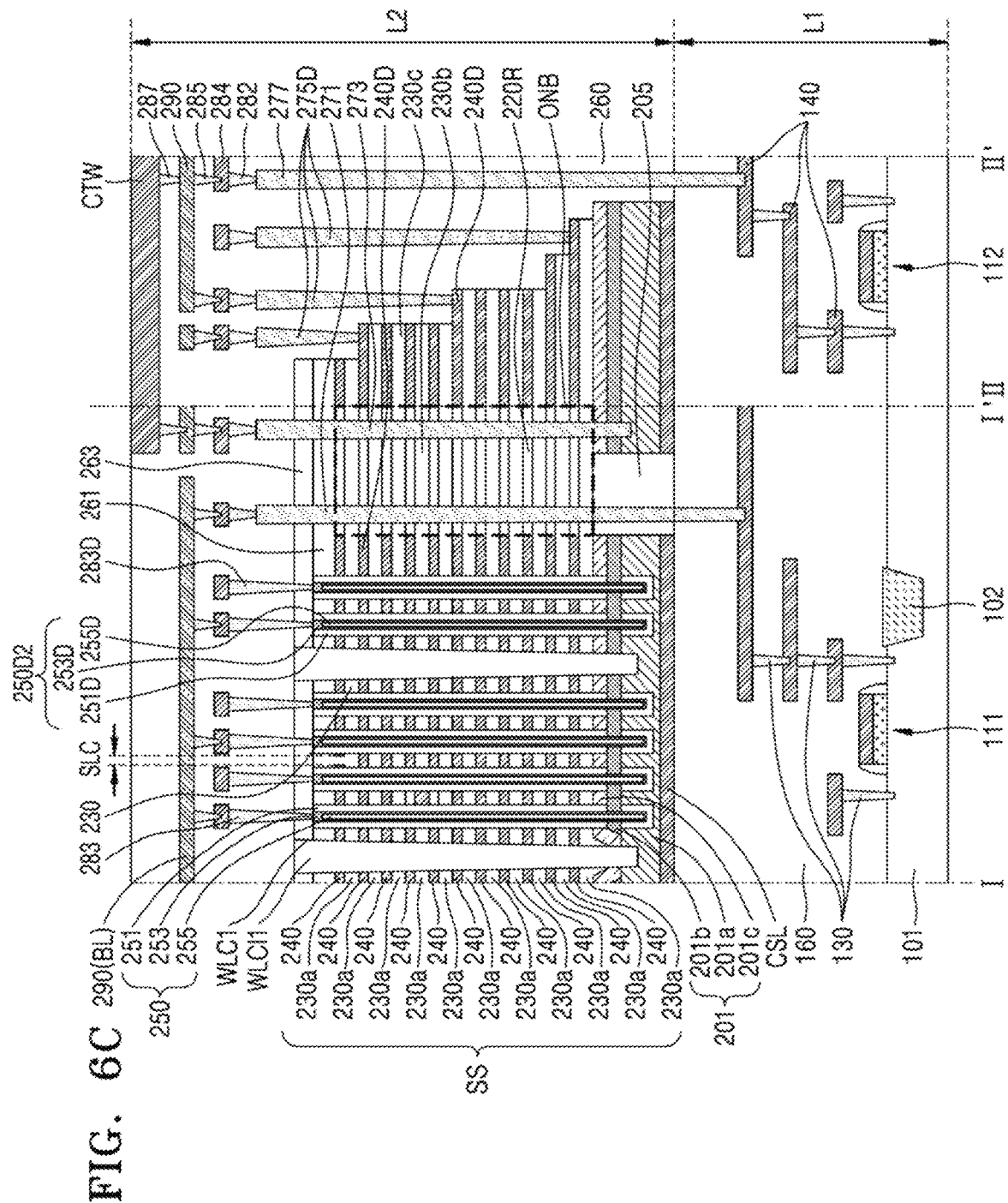
Figure 6D:
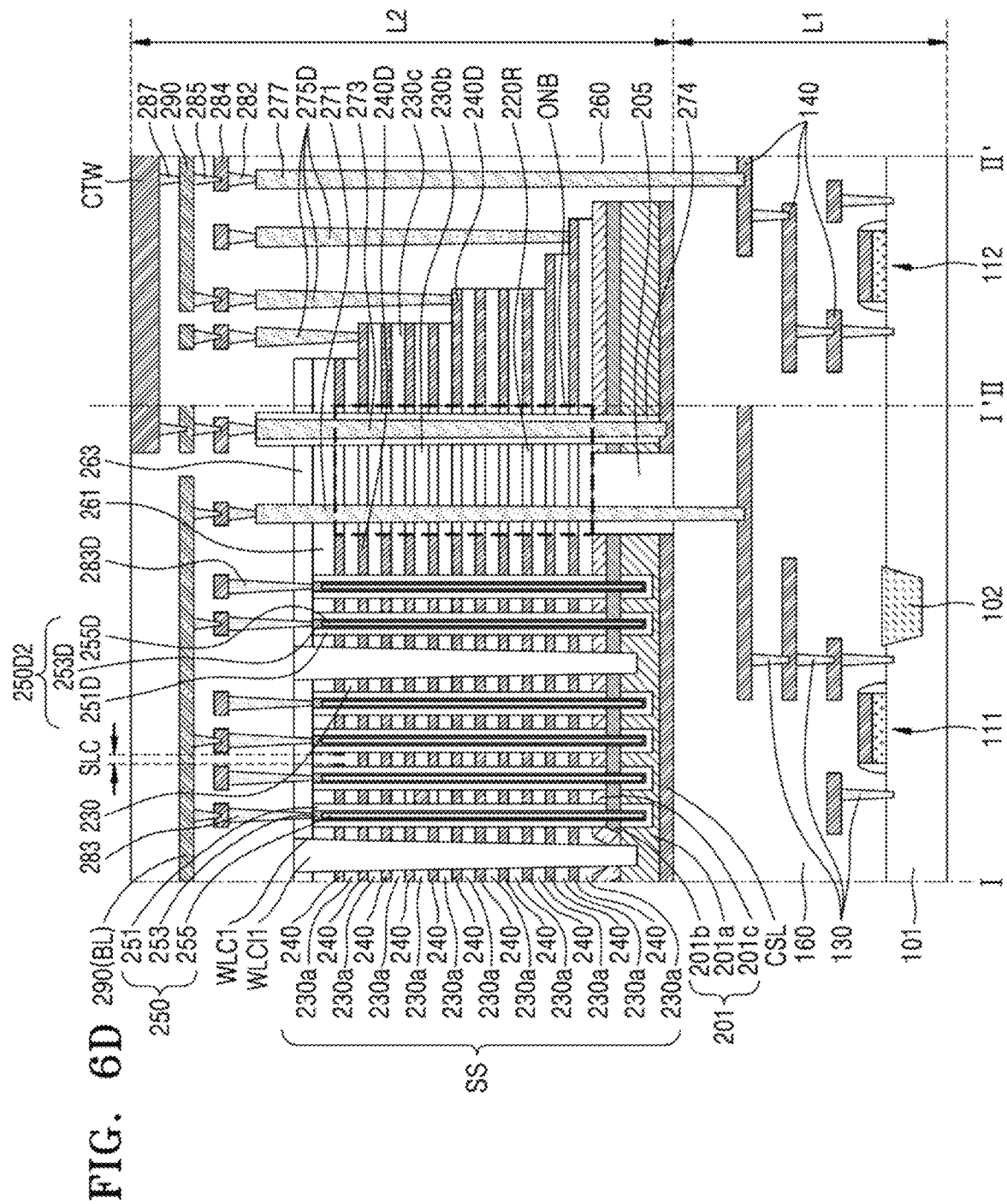

FIGS. 6B through 6D are cross-sectional views for explaining semiconductor memory devices, according to different embodiments of the inventive concept, and correspond to the cross-sectional view of FIG. 6A. Redundant descriptions given with reference to FIGS. 4 through 6A will be omitted, and descriptions below will be focused mostly on the differences.

Referring to FIG. 6B, the common source line CSL may not be overetched but may be in contact with the second through via 273, differently from FIG. 6A. Accordingly, the bottom surface of the second through via 273 may be at the same level as the top surface of the common source line CSL. In FIG. 6A, the second through via 273 does not reach the lower insulating layer 160.

Referring to FIG. 6C, the second through via 273 may not be in contact with the common source line CSL, differently from FIGS. 6A and 6B. Accordingly, the bottom surface of the second through via 273 may be at a vertical level higher than the top surface of the common source line CSL. According to exemplary embodiments of the inventive concept, the upper substrate 201 may be between the second through via 273 and the common source line CSL. For example, in FIG. 6C, the second through via 273 may protrude partially into the first upper substrate layer 201a. In this case, the upper substrate 201 may include polysilicon doped with impurities at a high concentration, and therefore, the second through via 273 may be electrically connected to the common source line CSL.

Referring to FIG. 6D, a through via liner 274 surrounding a side surface of the second through via 273 may be further provided, differently from FIGS. 6A through 6C. Accordingly, the second through via 273 may be separated from the residual sacrificial films 220R and the insulation films 230. According to exemplary embodiments of the inventive concept, the through via liner 274 may be in contact with the residual sacrificial films 220R and the insulation films 230.

FIGS. 7A through 7D are plan views of semiconductor memory devices 10a, 10b, and 10c according to different embodiments of the inventive concept. Redundant descriptions given with reference to FIGS. 4 through 6A will be omitted, and descriptions below will be focused mostly on the differences.

Figure 7A:
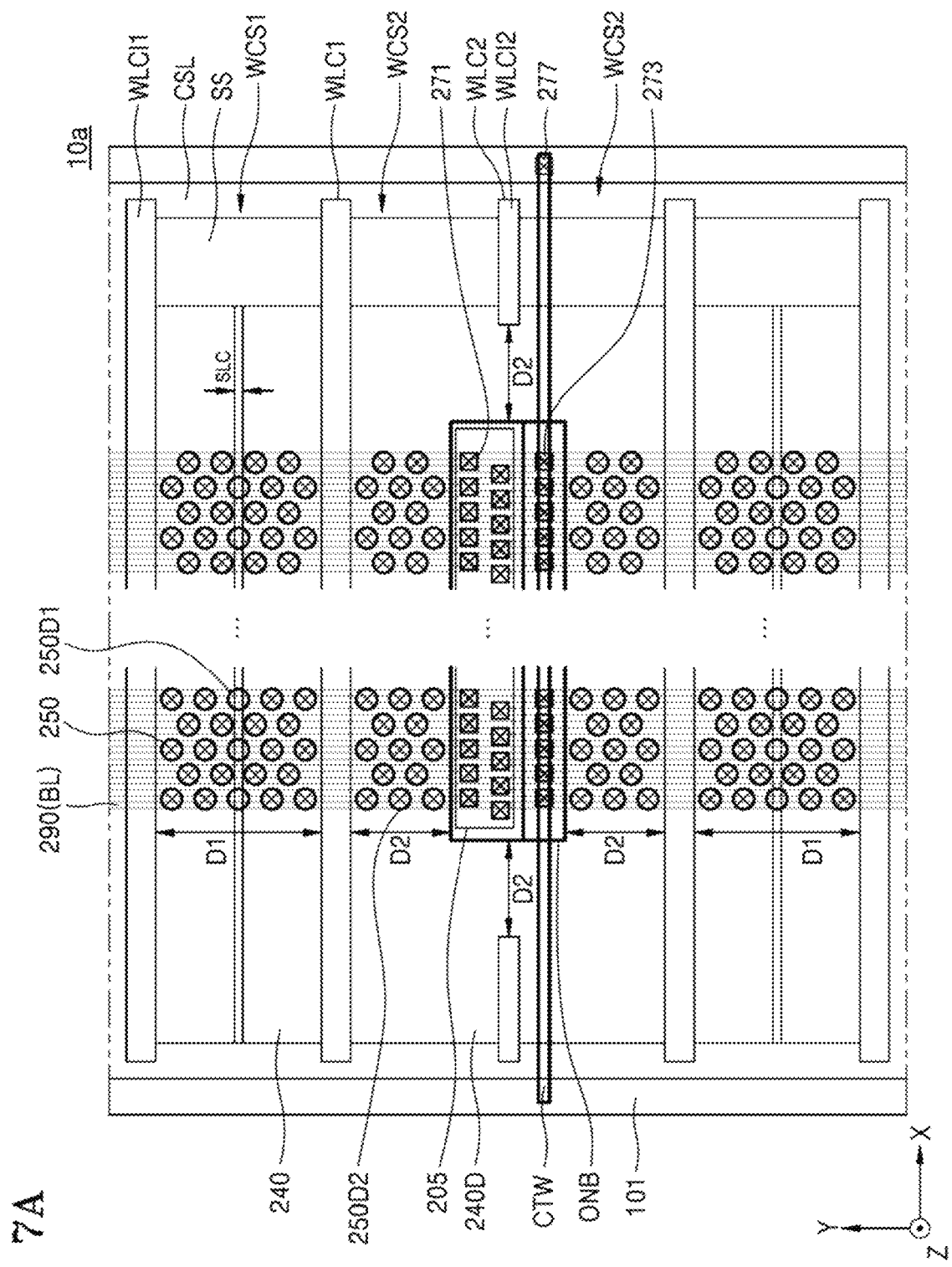
FIGS. 7A, 7B, 7C and 7D are plan views of semiconductor memory devices according to exemplary embodiments of the inventive concept.

Differently from that the profile of the intermediate insulation film 205 and the profile of the O-N box ONB share one side on the plan view of FIG. 4, the profile of the intermediate insulation film 205 may be included in the profile of the O-N box ONB in the plan view of the semiconductor memory device 10a of FIG. 7A. Accordingly, the profile of each of the intermediate insulation film 205 and the O-N box ONB may have a quadrangular shape, and each side of the intermediate insulation film 205 may be shorter than a corresponding side of the O-N box ONB.

Figure 7B:
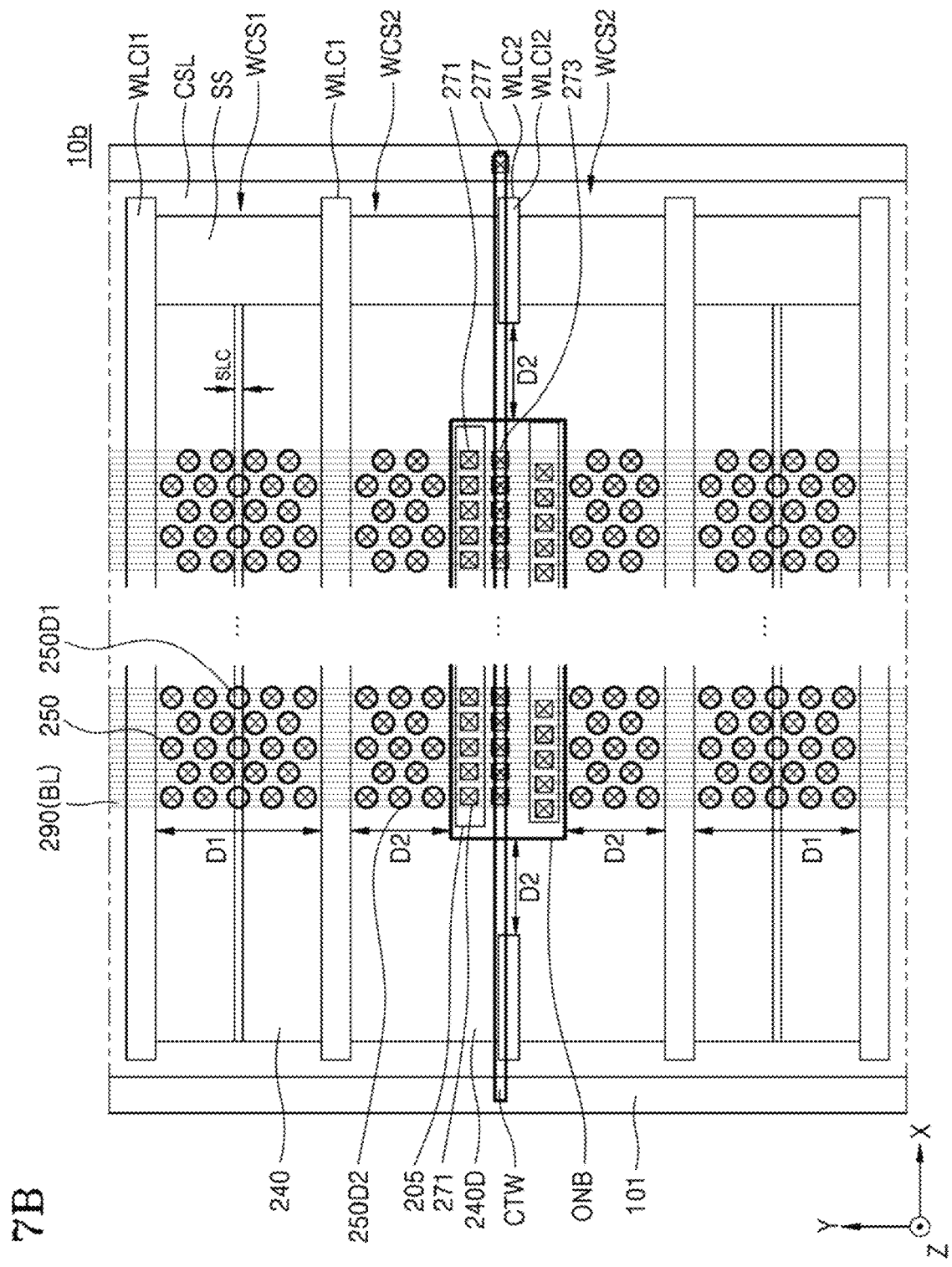

In the semiconductor memory device 10b of FIG. 7B, a plurality of intermediate insulation films 205 may be separated from each other below the O-N box ONB. According to exemplary embodiments of the inventive concept, when viewed from above, the intermediate insulation films 205 may be separated from each other with the common source line tapping wiring CTW therebetween.

Figure 7C:
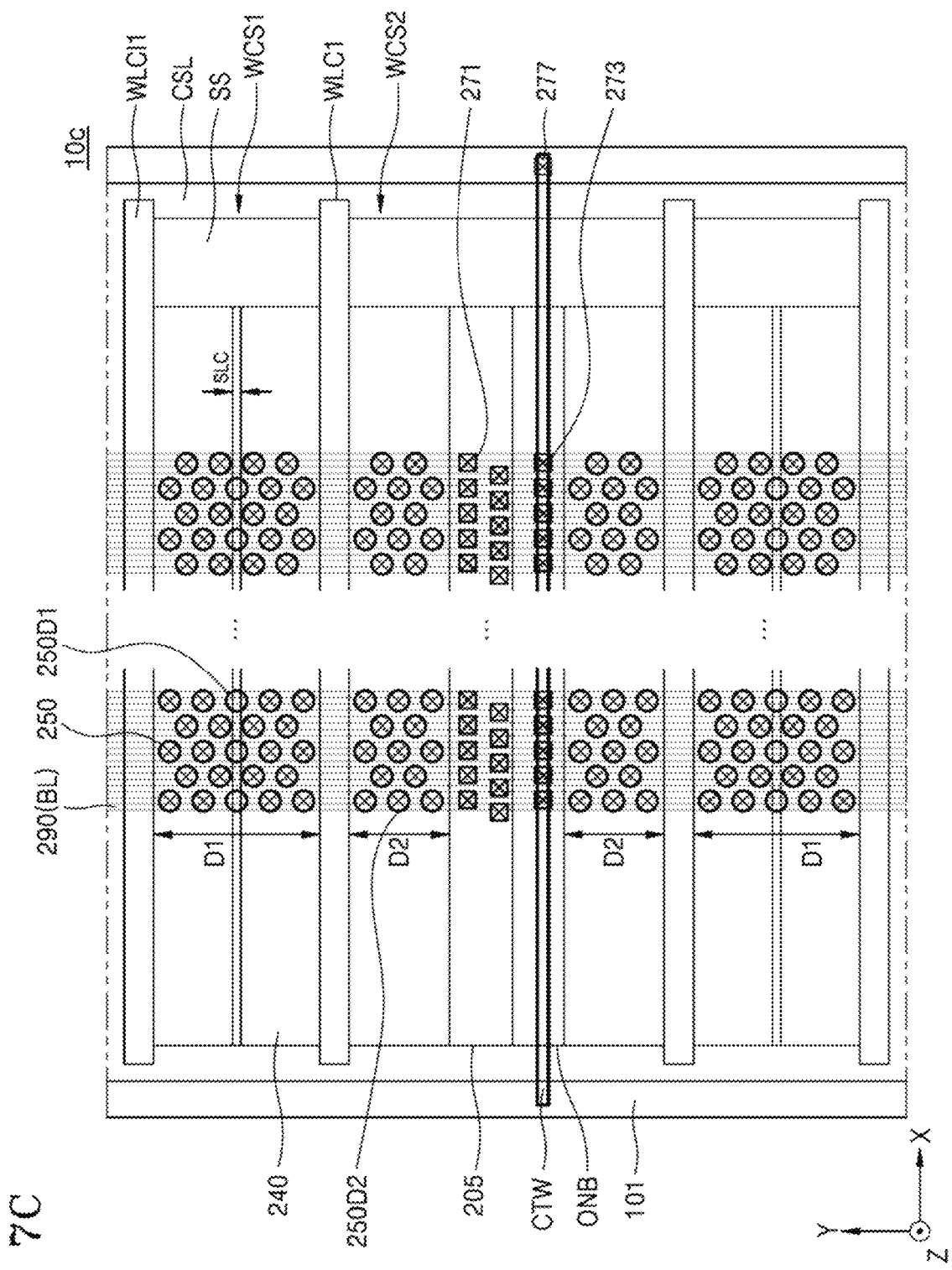

In the semiconductor memory device 10c of FIG. 7C, the second word line cut WLC2 and the second word line cut filling film WLCI2 in FIG. 4 may be omitted. Accordingly, the O-N box ONB and the intermediate insulation film 205 may have the same length in the second direction, e.g., the X-direction, and the lengths of the O-N box ONB and the intermediate insulation film 205 may substantially the same as the length of the stack structure SS in the second direction, e.g., the X-direction.

Figure 7D:
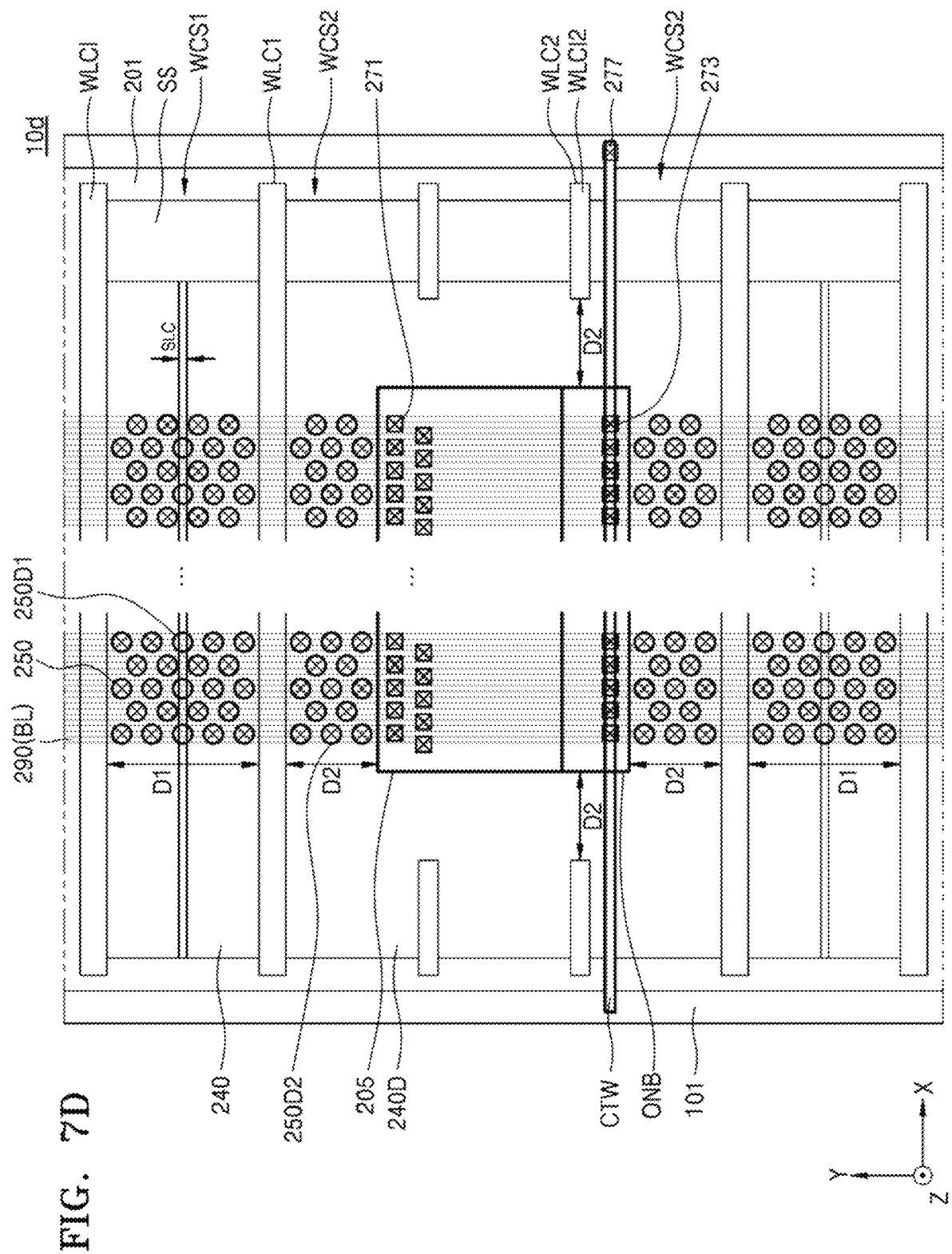

The semiconductor memory device 10d of FIG. 7D (may include a plurality of second word line cuts WLC2 and second word line cut filling films WLCI2, which respectively fill the second word line cuts WLC2, between two first word line cuts WLC1. Accordingly, the length of the O-N box ONB in the third direction, e.g., the Y-direction, may be greater than that when a single second word line cut is provided. According to exemplary embodiments of the inventive concept, a distance between adjacent second word line cuts WLC2 may be the same as or different from a distance between adjacent first word line cuts WLC1.

Figure 8:
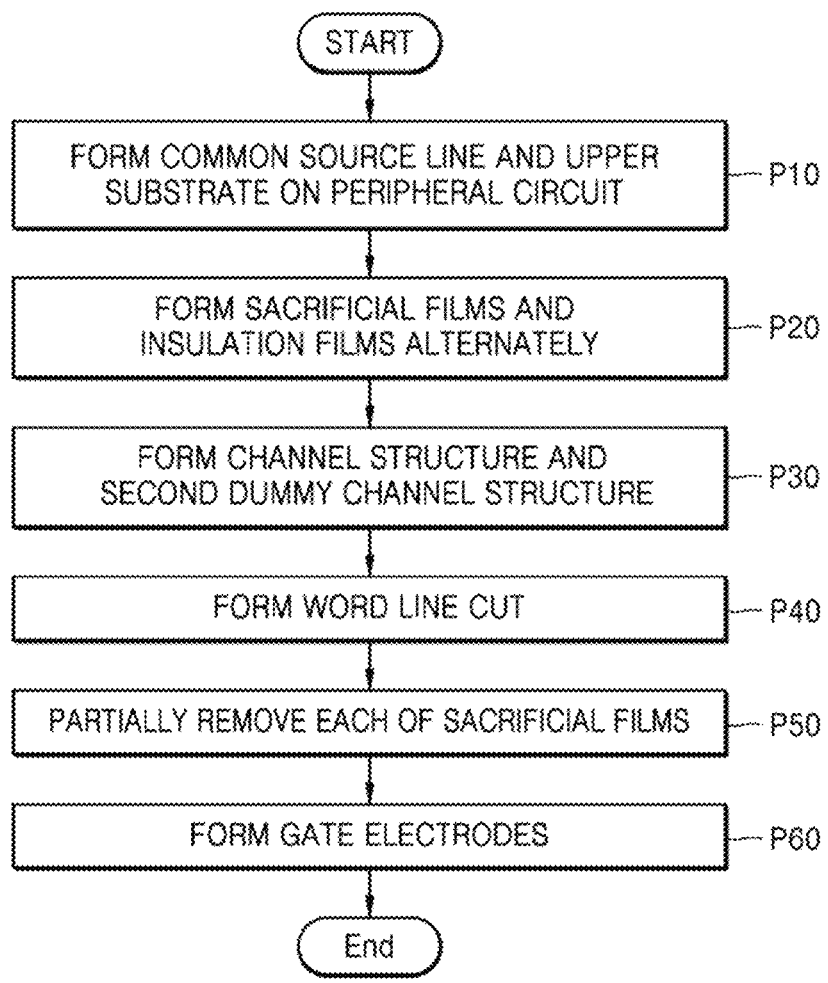
FIG. 8 is a flowchart of a method of manufacturing a semiconductor memory device, according to exemplary embodiments of the inventive concept.

FIG. 8 is a flowchart of a method of manufacturing a semiconductor memory device, according to exemplary embodiments of the inventive concept. FIGS. 9A through 9K are cross-sectional views of stages in a method of manufacturing a semiconductor memory device, according to exemplary embodiments of the inventive concept. For example, FIGS. 9A through 9K correspond to FIG. 6A.

Figure 9A:
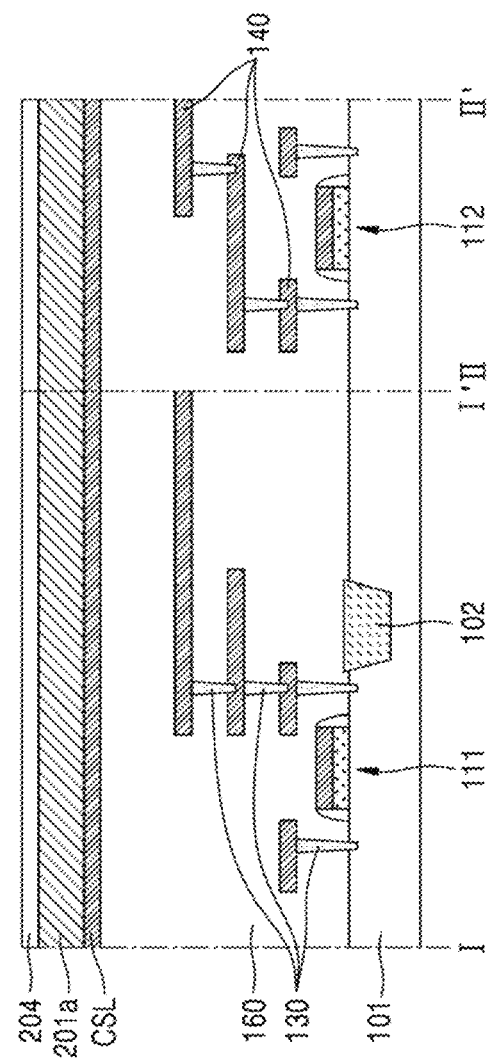
FIGS. 9A, 9B, 9C, 9D, 9E, 9F, 9G, 9H, 9I, 9J and 9K are cross-sectional views of stages in a method of manufacturing a semiconductor memory device, according to exemplary embodiments of the inventive concept.

Referring to FIGS. 8 and 9A, a common source line and an upper substrate may be formed on a peripheral circuit in operation P10. According to exemplary embodiments of the inventive concept, the forming of the common source line and the upper substrate may include forming the peripheral circuit and forming a common source line CSL, a first upper substrate layer 201a, and an upper substrate sacrificial layer 204.

The forming of the peripheral circuit may include forming an isolation layer 102 in a lower substrate 101, forming a p-well region and an n-well region in order (or in reverse order) in the lower substrate 101 by performing a first ion implantation process using a photoresist pattern on the lower substrate 101, forming a peripheral transistor, and forming a peripheral circuit wiring by patterning a conductive material and providing an insulating material.

According to exemplary embodiments of the inventive concept, the common source line CSL, the first upper substrate layer 201a, and the upper substrate sacrificial layer 204 may be formed on the peripheral circuit using chemical vapor deposition, atomic layer deposition, or physical vapor deposition, using polysilicon doped with first impurities. According to exemplary embodiments of the inventive concept, the upper substrate sacrificial layer 204 may include an insulating material. According to exemplary embodiments of the inventive concept, the upper substrate sacrificial layer 204 may include silicon oxide, silicon nitride, or silicon oxynitride. According to exemplary embodiments of the inventive concept, the upper substrate sacrificial layer 204 may have a higher etch selectivity than insulation films (230 in FIG. 9D) described below.

Figure 9B:
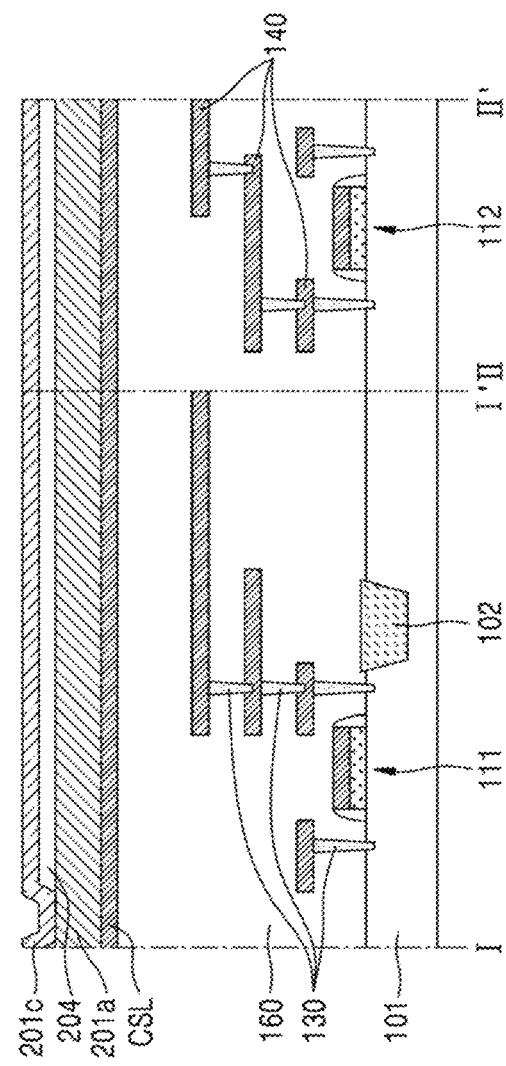

Thereafter, referring to FIG. 9B, the upper substrate sacrificial layer 204 may be patterned and partially removed, and a third upper substrate layer 201c may be provided conformally. Accordingly, the third upper substrate layer 201c may be in contact with the first upper substrate layer 201a in a portion in which the upper substrate sacrificial layer 204 is partially removed.

Figure 9C:
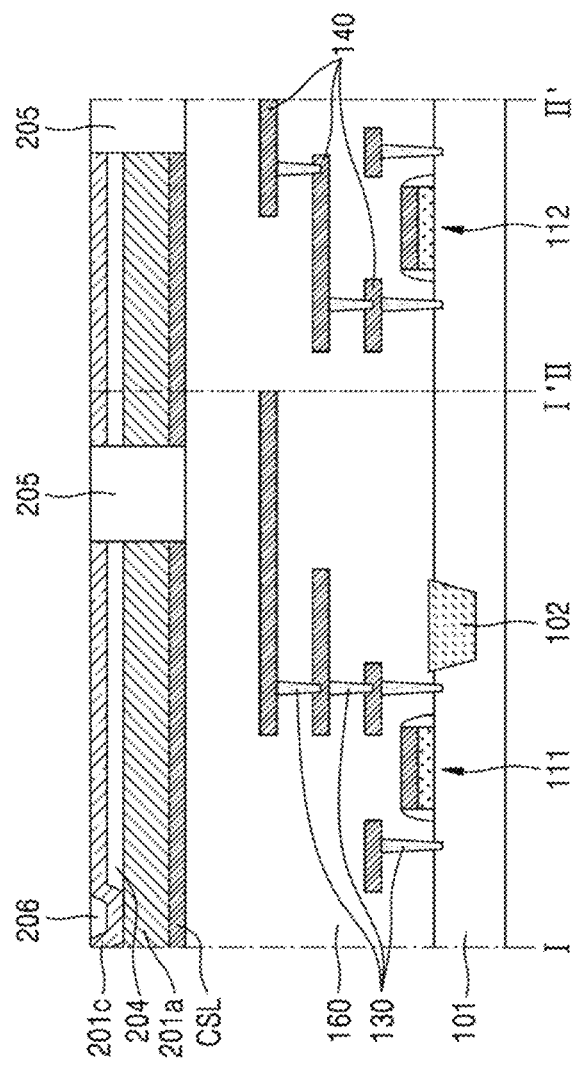

Thereafter, referring to FIG. 9C, intermediate insulation films 205 and 206 may be formed. The forming of the intermediate insulation films 205 and 206 may include etching the common source line CSL, the first upper substrate layer 201a, the upper substrate sacrificial layer 204, and the third upper substrate layer 201c such that a top surface of a lower insulating layer 160 is exposed, providing an insulating material to fill openings formed through the etching, and performing a planarization such that a top surface of the third upper substrate layer 201c is exposed.

Figure 9D:
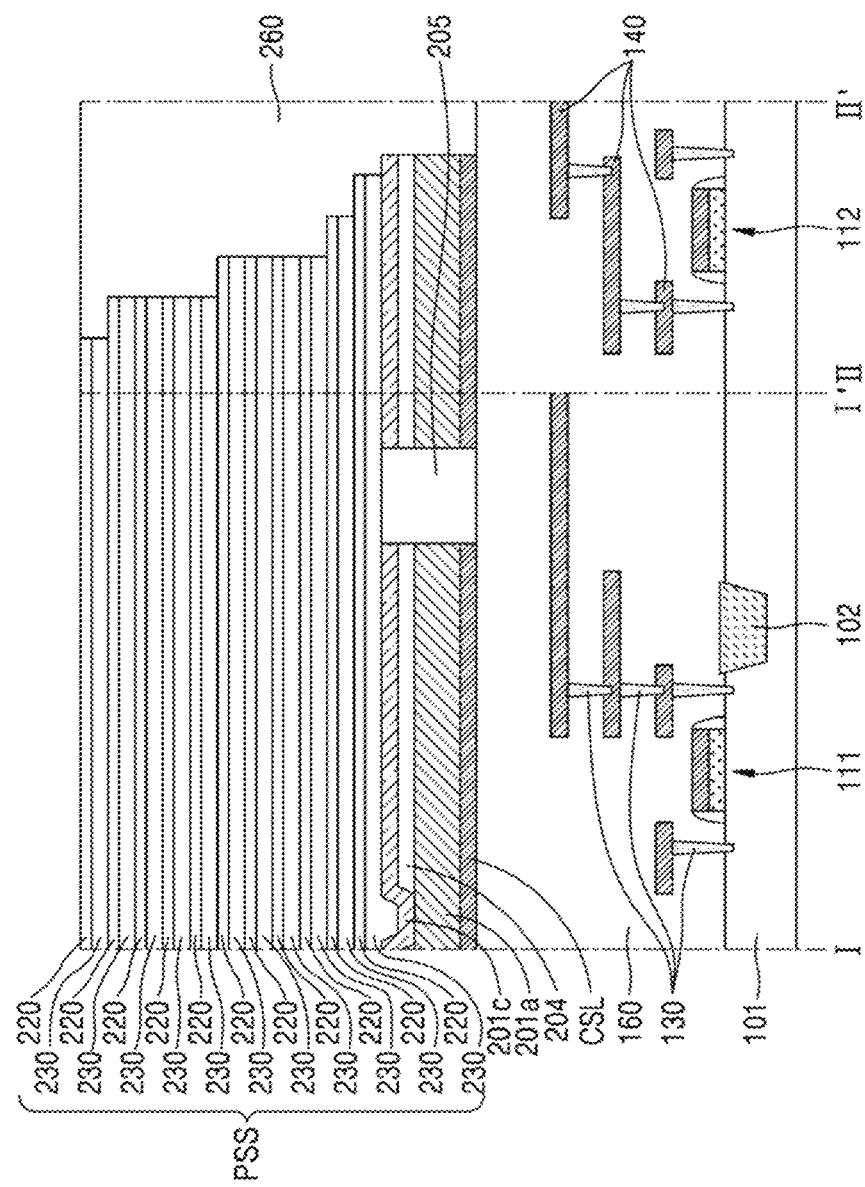

Referring to FIGS. 8 and 9D, a preliminary stack structure PSS including sacrificial films 220 and the insulation films 230 may be formed on the third upper substrate layer 201c in operation P20. According to exemplary embodiments of the inventive concept, the preliminary stack structure PSS may have a similar step structure to the stack structure SS described above. According to exemplary embodiments of the inventive concept, the preliminary stack structure PSS may include the insulation films 230 and the sacrificial films 220, which are stacked alternately. In this case, one of the insulation films 230 may be disposed directly on the third upper substrate layer 201c. According to exemplary embodiments of the inventive concept, the insulation films 230 may have a different material than the sacrificial films 220. According to exemplary embodiments of the inventive concept, the insulation films 230 and the sacrificial films 220 may have a high etch selectivity. For example, when the insulation films 230 include silicon oxide, the sacrificial films 220 may include undoped polysilicon or silicon nitride. When the insulation films 230 include silicon nitride, the sacrificial films 220 may include undoped polysilicon or silicon oxide. When the insulation films 230 include undoped polysilicon, the sacrificial films 220 may include silicon nitride or silicon oxide.

According to exemplary embodiments of the inventive concept, an upper insulating layer 260 may be formed to cover the step structure. The upper insulating layer 260 may include an insulating material. When the upper insulating layer 260 includes the same material as the intermediate insulation film 205, the upper insulating layer 260 and the intermediate insulation film 205 may form an integrated structure. Hereinafter, it is assumed that the intermediate insulation film 205 is integrated into the upper insulating layer 260. Similarly, the intermediate insulation film 206 may be integrated into a lowest insulation film 230.

Figure 9E:
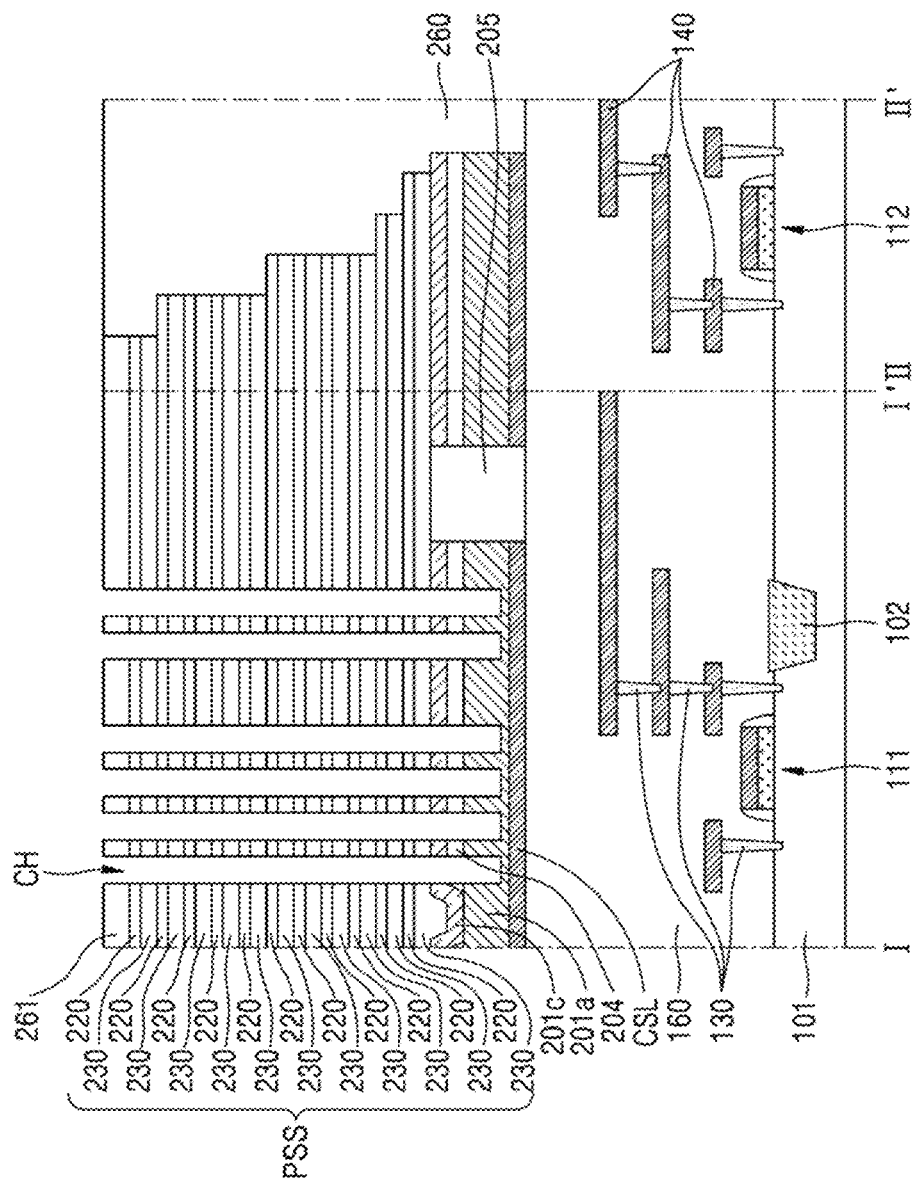
Figure 9F:
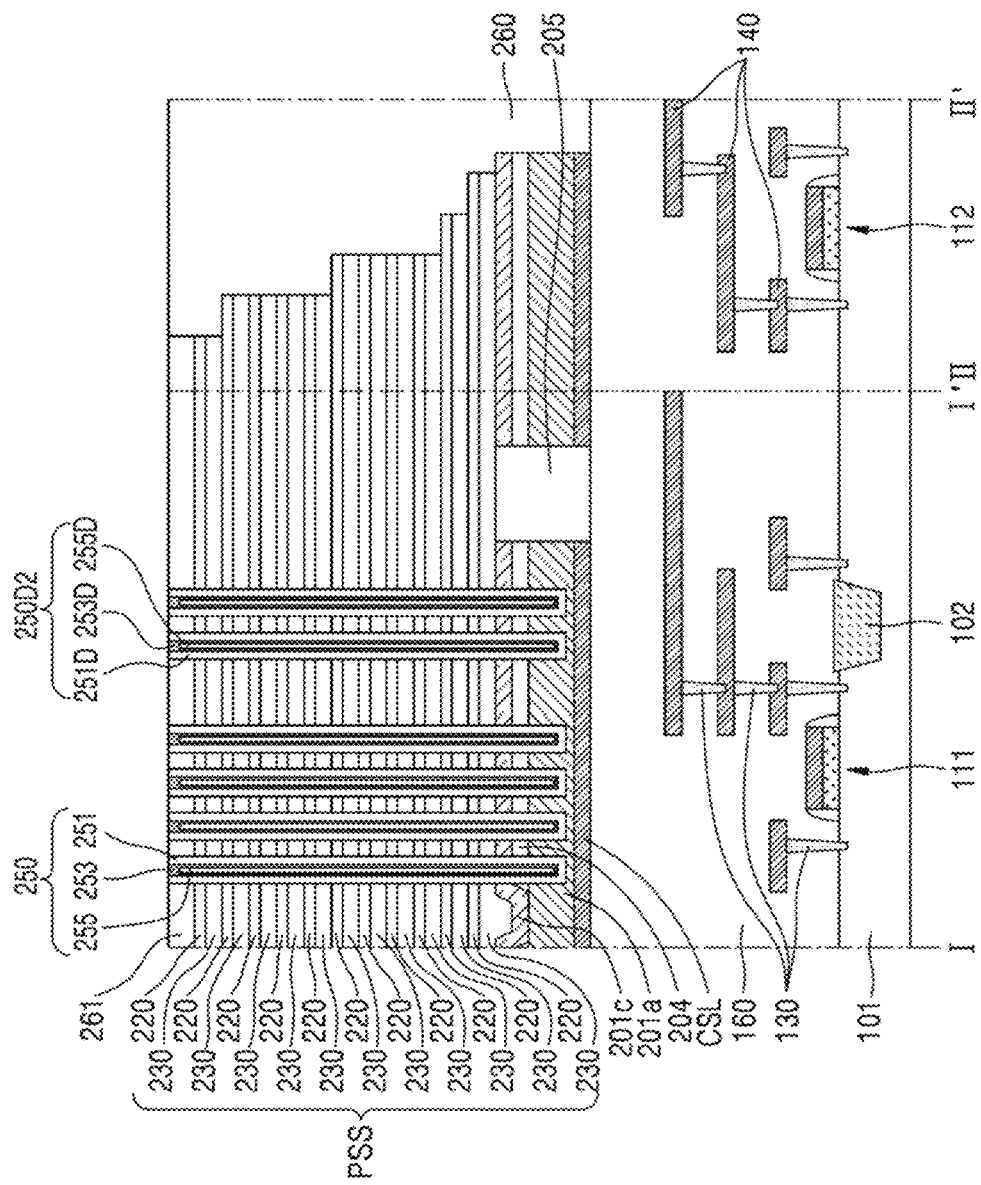

Referring to FIGS. 8, 9E, and 9F, a channel structure 250 and a second dummy channel structure 250D2 may be formed in operation P30. For example, a first upper insulating layer 261 may be provided on the preliminary stack structure PSS, and a plurality of channel holes CH may be formed in the first upper insulating layer 261 and the preliminary stack structure PSS using photoresist. According to exemplary embodiments of the inventive concept, the channel holes CH may extend to the first upper substrate layer 201a. Thereafter, a gate insulating material film, a channel material film, and a buried insulating material film may be subsequently provided, and the material films filling the channel holes CH may be separated by performing an etch back process to expose a top surface of the first upper insulating layer 261. Thereafter, a top portion of the buried insulating material film in the channel holes CH may be removed, and the same material as the channel material film may be deposited such that a buried insulating film 255 and a dummy buried insulating layer 255D may be completely covered with a channel layer 253 and a dummy channel layer 253D, respectively. Accordingly, pads for contact with the bit line contact vias 283 of FIG. 6A may be formed thereon.

Figure 9G:
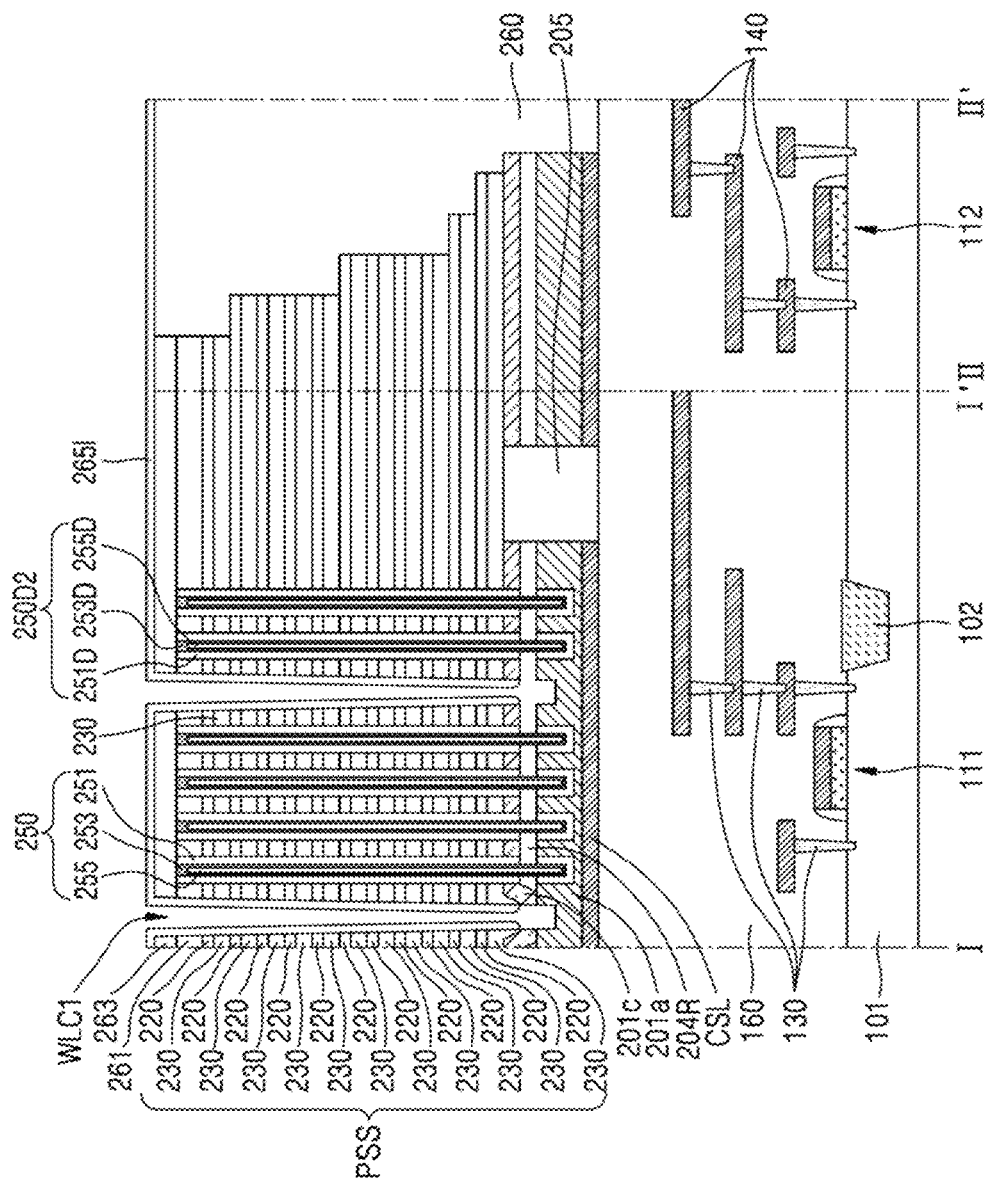

Referring to FIGS. 8 and 9G, a word line cut may be formed in operation P40. Although only a first word line cut WLC1 is shown in FIG. 9G, the second word line cut WLC2 shown in FIG. 4 may be simultaneously formed.

According to exemplary embodiments of the inventive concept, a second upper insulating layer 263 may be formed on the first upper insulating layer 261, and then the first word line cut WLC1 may be formed. A word line cut liner 2651 may be provided over the first word line cut WLC1, and a lower portion of the word line cut liner 2651 may be removed using an etch back process. Accordingly, the upper substrate sacrificial layer 204 in FIG. 9F may be exposed. According to exemplary embodiments of the inventive concept, the word line cut liner 2651 may include a material having a higher etch selectivity than the upper substrate sacrificial layer 204. According to exemplary embodiments of the inventive concept, the word line cut liner 2651 may protect the sacrificial films 220 in the preliminary stack structure PSS during a process of removing the upper substrate sacrificial layer 204.

According to exemplary embodiments of the inventive concept, an upper substrate recess 204R may be formed by selectively removing the upper substrate sacrificial layer 204. At this time, a portion of the gate insulating film 251 and a portion of the dummy buried insulating layer 255D, which are at the same level as the upper substrate recess 204R, may also be removed together. Since the third upper substrate layer 201c is partially in contact with the first upper substrate layer 201a, the first and third upper substrate layers 201a and 201c and the preliminary stack structure PSS arranged thereon may be prevented from collapsing.

Figure 9H:
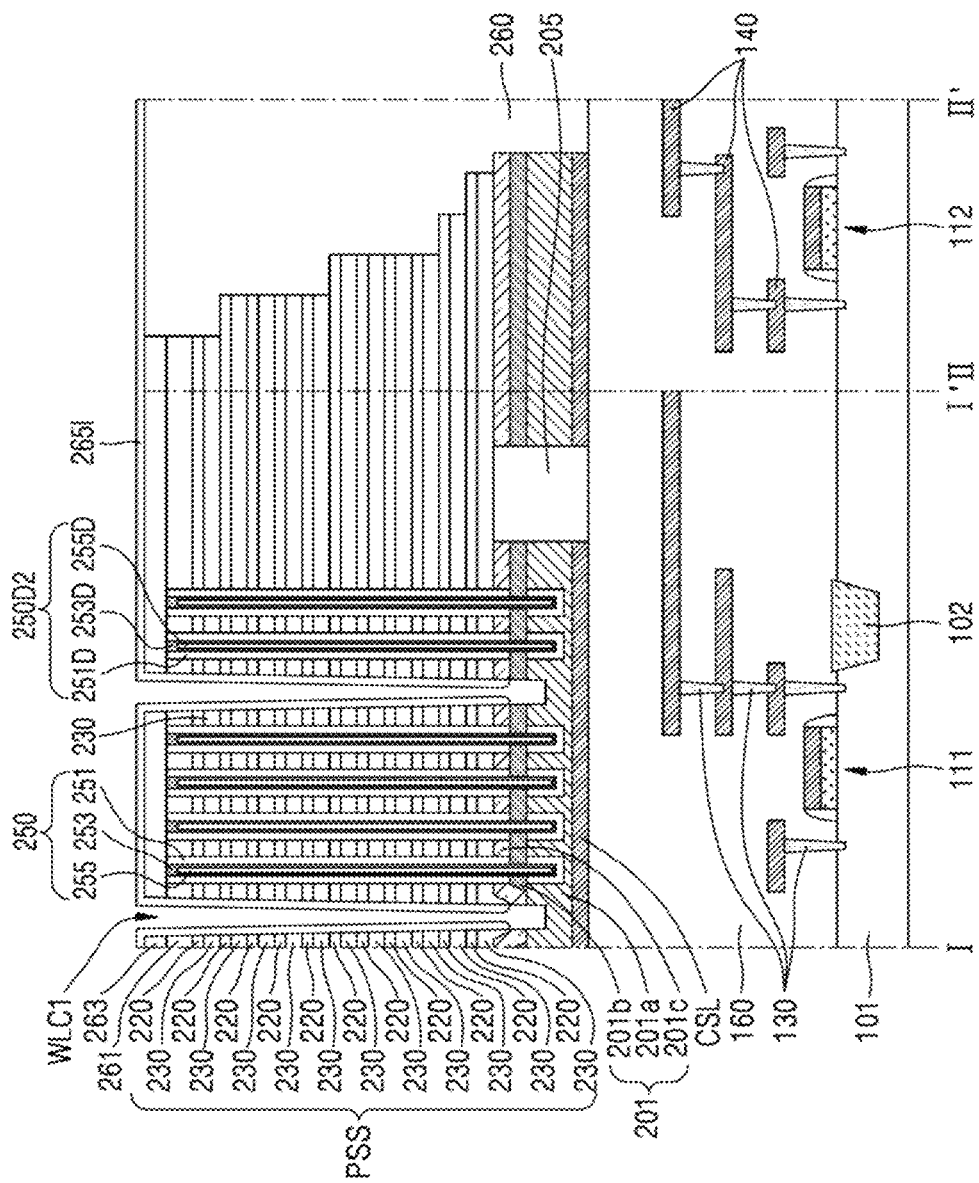

Thereafter, referring to FIG. 9H, a second upper substrate layer 201b filling the upper substrate recess 204R may be provided. As described above, the second upper substrate layer 201b may include polysilicon doped with impurities at about the same concentration as the first and third upper substrate layers 201a and 201c. Since the gate insulating film 251 and the dummy buried insulating layer 255D have been partially removed as described above with reference to FIG. 9G, the second upper substrate layer 201b may be in contact with the channel layer 253. Accordingly, a charge transfer path for allowing the channel structure 250 function as memory cells may be formed.

Figure 9I:
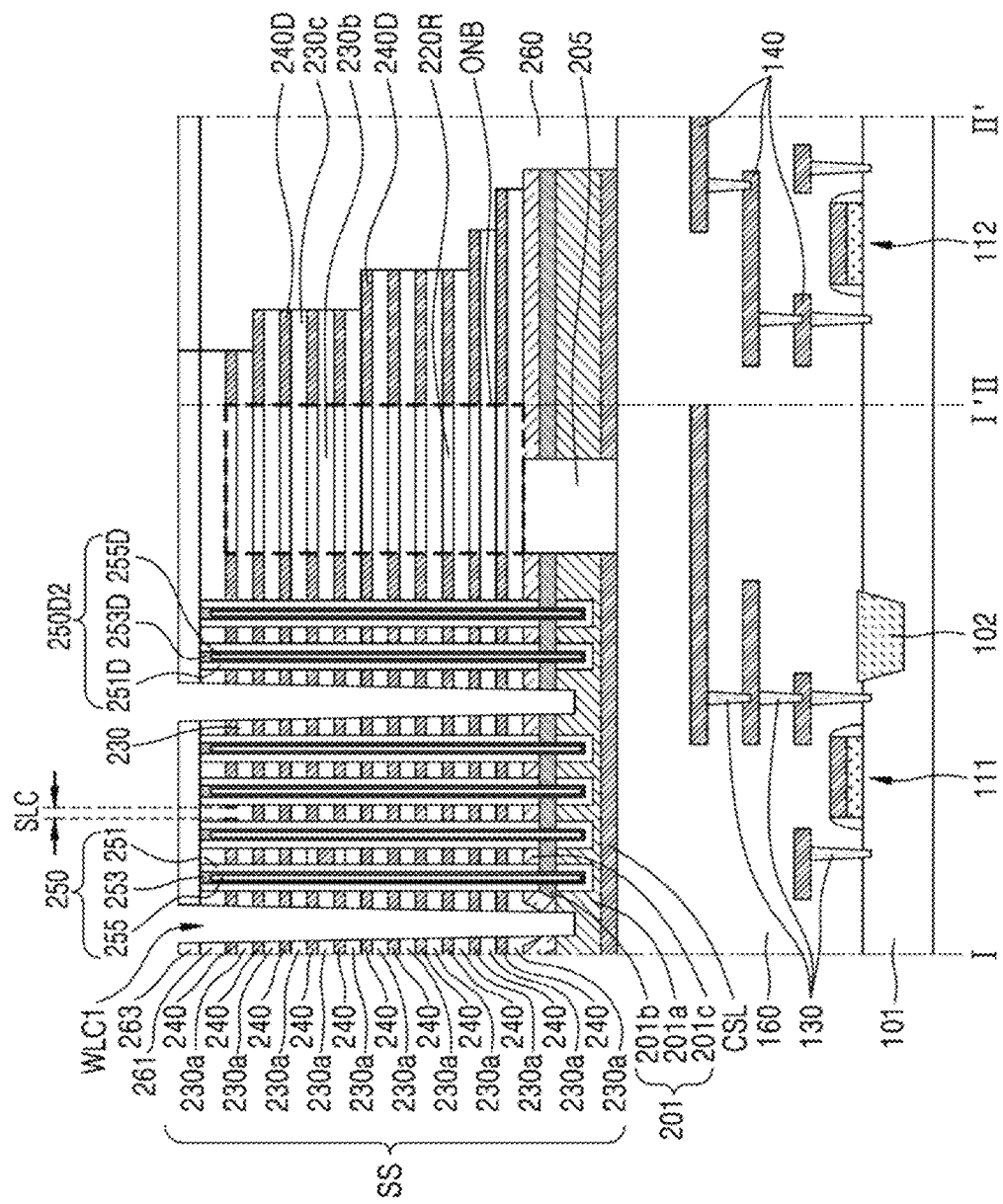

Thereafter, referring to FIGS. 8 and 9I, the sacrificial films 220 are partially removed in operation P50, and gate electrodes may be formed in operation P60. For example, the word line cut liner 265l in FIG. 9H may be removed, and the sacrificial films 220 may be selectively removed. According to exemplary embodiments of the inventive concept, the sacrificial films 220 have a higher etch selectivity than the insulation films 230 and the first through third upper substrate layers 201a, 201b, and 201c and may thus be easily removed. At this time, a portion of each of the sacrificial films 220, which is farther apart than the second distance D2 from each of the first word line cut WLC1 and the second word line cut WLC2 (see FIG. 4), may not be removed such that residual sacrificial films 220R and an O-N box ONB including the residual sacrificial films 220R may be formed.

According to exemplary embodiments of the inventive concept, a gate electrode 240 and a dummy gate electrode 240D may be formed in a space resulting from partially removing each sacrificial film 220. According to exemplary embodiments of the inventive concept, after the gate electrodes 240 are formed, a selection line cut SLC may be formed to divide a topmost one of the gate electrodes 240, and a recessed space may be filled with an insulating material.

Figure 9J:
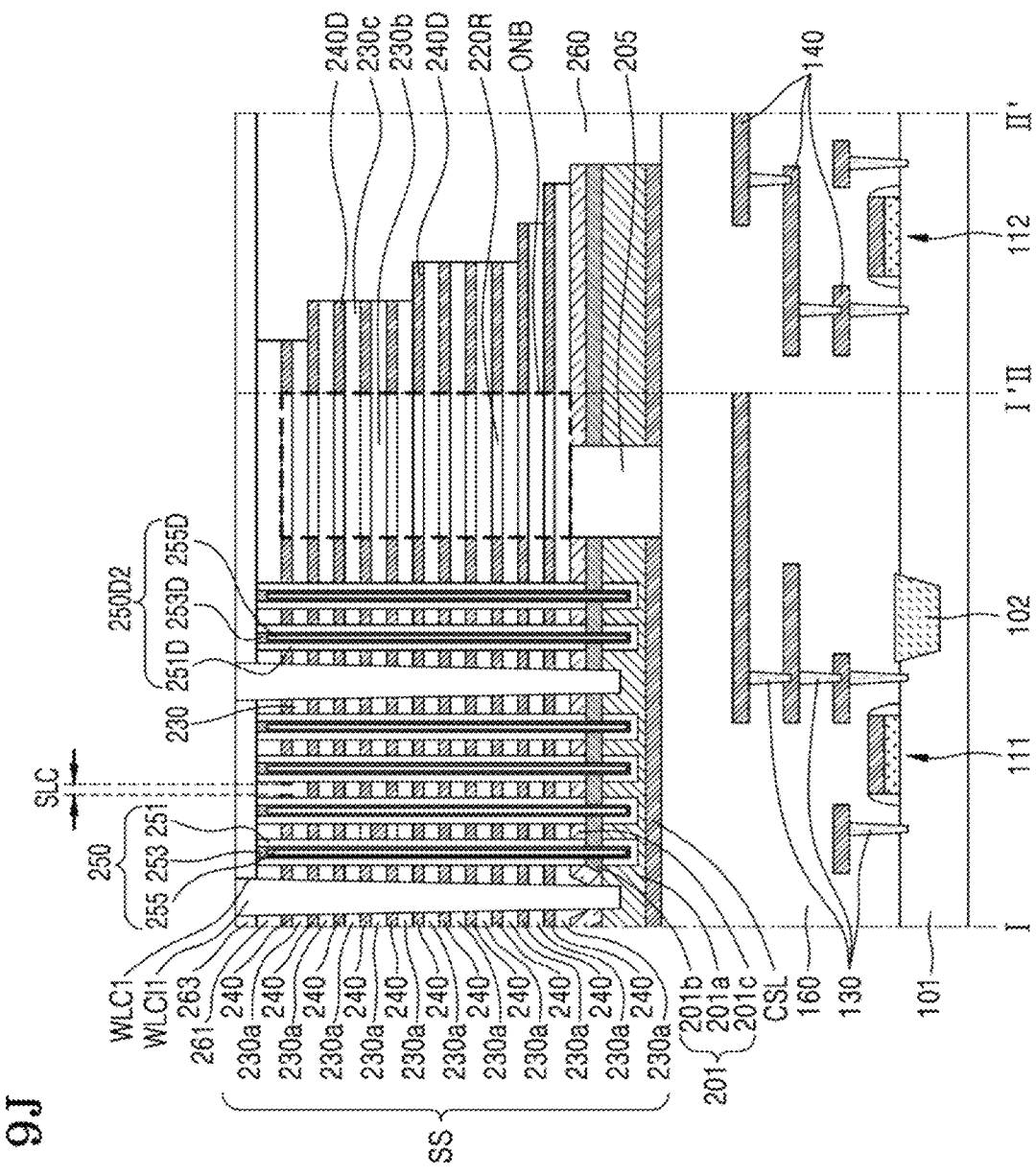

Thereafter, referring to FIG. 9J, a first word line cut filling film WLCl1 may be provided in the first word line cut WLC1. According to exemplary embodiments of the inventive concept, the second word line cut filling film WLCl2 in FIG. 4 may also be provided.

Figure 9K:
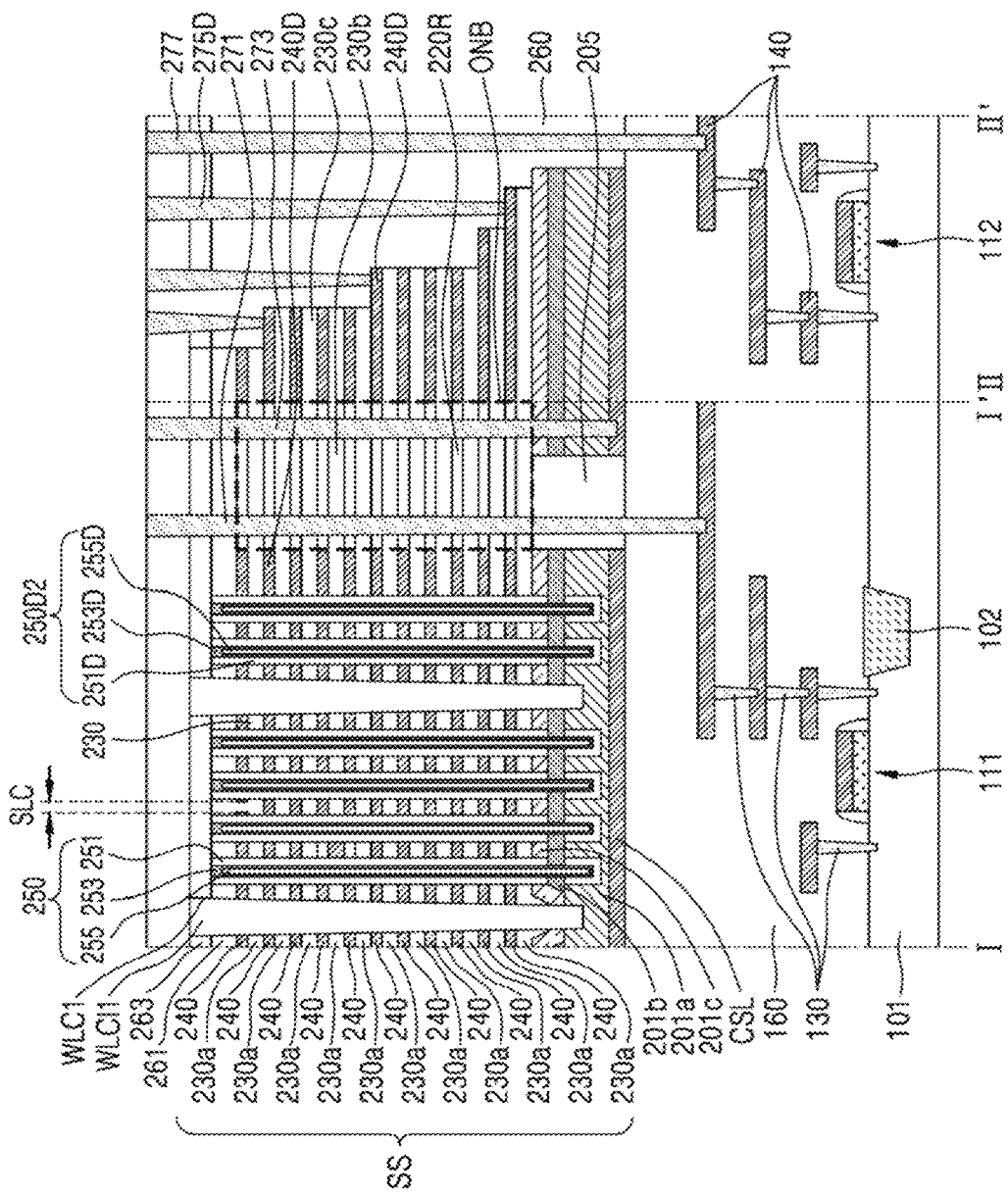

Thereafter, referring to FIG. 9K, the upper insulating layer 260 may be additionally provided to cover a resultant structure, and first through third through vias 271, 273, and 277 and dummy word line contact vias 275D may be formed. According to exemplary embodiments of the inventive concept, the word line contact vias 275 in FIG. 5A may also be formed together.

According to exemplary embodiments of the inventive concept, the first through via 271 may penetrate through the O-N box ONB and the intermediate insulation film 205 to be connected to the peripheral circuit wiring. According to exemplary embodiments of the inventive concept, the second through via 273 may penetrate through the O-N box ONB to be connected to the common source line CSL. According to exemplary embodiments of the inventive concept, the third through via 277 may partially penetrate through the upper insulating layer 260 and the lower insulating layer 160 to be connected to peripheral wirings. Accordingly, the third through via 277 may be electrically connected to the peripheral transistor 112.

Thereafter, referring back to FIG. 6A, a wiring process may be performed on a resultant structure. Accordingly, the common source line CSL may be electrically connected to the peripheral transistor 112 through the second through via 273, the common source line tapping wiring CTW, and the third through via 277.

Exemplary embodiments of the inventive concept provide a semiconductor memory device with enhanced noise characteristics and reliability, and a method of manufacturing the semiconductor memory device.

While the inventive concept has been particularly shown and described with reference to exemplary embodiments thereof, it will be understood that various changes in form and details may be made thereto without departing from the spirit and scope of the inventive concept as defined by the following claims.

What is claimed is:

1. A method of manufacturing a semiconductor memory device, the method comprising:
   forming a common source line and a substrate on a peripheral circuit including a peripheral transistor;
   forming a preliminary stack structure that includes sacrificial films and insulation films alternately stacked in a vertical direction on the substrate;
   forming first and second word line cuts that extend in a first horizontal direction on the substrate and penetrate the preliminary stack structure in the vertical direction, the first word line cuts having a different length than the second word line cuts in the first horizontal direction; and
   forming a box structure that is apart from both the first and the second word line cuts by a first distance by replacing a portion of each of the sacrificial films that is within the first distance from the first and the second word line cuts with a gate electrode.

2. The method of claim 1, wherein the second word line cuts are formed between two first word line cuts adjacent to each other in a second horizontal direction perpendicular to the first horizontal direction among the first word line cuts.

3. The method of claim 1, wherein the first word line cuts are longer than the preliminary stack structure in the vertical direction and the second word line cuts are shorter than the preliminary stack structure in the vertical direction.

4. The method of claim 1, further comprising forming a through via that penetrates the box structure and the substrate, and contacts the common source line.

5. The method of claim 4, further comprising forming a common source line tapping wiring on the through via.

6. The method of claim 1, further comprising forming a through via that penetrates the box structure and a portion of the substrate, and does not contact the common source line.

7. The method of claim 1, further comprising forming an intermediate insulation film that penetrates the substrate and the common source line before forming the preliminary stack structure, wherein the box structure overlaps the intermediate insulation film in the vertical direction.

8. The method of claim 7, further comprising forming a through via that penetrates the box structure and the intermediate insulation film, and contacts the peripheral circuit.

9. The method of claim 1, further comprising forming channel structures that penetrate the preliminary stack structure before forming the first and the second word line cuts.

10. A method of manufacturing a semiconductor memory device, the method comprising:
    forming a common source line and a substrate on a peripheral circuit including a peripheral transistor;
    forming a preliminary stack structure that includes sacrificial films and insulation films alternately stacked in a vertical direction on the substrate;
    forming word line cuts that penetrate the preliminary stack structure in the vertical direction;

forming a box structure by replacing a portion of each of the sacrificial films that is around the word line cuts with a gate electrode;

forming a first through via that penetrates the box structure and the substrate, and that contacts the common source line.

11. The method of claim 10, further comprising forming an intermediate insulation film that penetrates the substrate and the common source line substrate before forming the preliminary stack structure, wherein the box structure overlaps the intermediate insulation film in the vertical direction.

12. The method of claim 11, further comprising forming a second through via that penetrates the box structure and the intermediate insulation film.

13. The method of claim 10, further comprising forming a common source line tapping wiring on the box structure, wherein the first through via connects the common source line and the common source line tapping wiring.

14. The method of claim 10, further comprising forming channel structures that penetrate the preliminary stack structure before forming the first and the second word line cuts.

15. A method of manufacturing a semiconductor memory device, the method comprising:

forming a peripheral circuit that includes a peripheral transistor, a peripheral circuit wiring, and a lower insulating layer covering the peripheral transistor and the peripheral circuit wiring;

forming a first upper substrate layer, an upper substrate sacrificial layer, and a second upper substrate layer on the peripheral circuit;

forming an opening that exposes the lower insulating layer by etching a portion of the second upper substrate layer, a portion of the upper substrate sacrificial layer, a portion of the first upper substrate layer, and a portion of a common source line;

forming an intermediate insulation film that fills the opening;

forming a preliminary stack structure that includes sacrificial films and insulation films alternately stacked in a vertical direction on the second upper substrate layer and the intermediate insulation film;

forming first and second word line cuts that extend in a first horizontal direction on the second upper substrate layer and penetrate the preliminary stack structure, the second upper substrate layer and the upper substrate sacrificial layer, and a portion of the first upper substrate layer in the vertical direction;

replacing the upper substrate sacrificial layer with a third upper substrate layer;

forming a box structure that is apart from both the first and the second word line cuts by a first distance by replacing a portion of each of the sacrificial films that is within the first distance from the first and the second word line cuts with a gate electrode;

forming a first through via and a second through via that penetrate the box structure, the first through via having a different length than the second through via in the vertical direction.

16. The method of claim 15, wherein the first through via penetrates the first upper substrate layer, the second upper substrate layer, and the third upper substrate layer, and contacts the common source line.

17. The method of claim 16, further comprising forming a common source line tapping wiring on the first through via, wherein the first through via connects the common source line and the common source line tapping wiring.

18. The method of claim 15, wherein the box structure overlaps the intermediate insulation film in the vertical direction, and wherein the second through via penetrates the intermediate insulation film and a portion of the lower insulating layer, and contacts the peripheral circuit wiring.

19. The method of claim 15, wherein the first word line cuts are longer than the second word line cuts in the first horizontal direction.

* * * * *